United States Patent
Nishiyama

(10) Patent No.: US 6,548,875 B2
(45) Date of Patent: Apr. 15, 2003

(54) SUB-TENTH MICRON MISFET WITH SOURCE AND DRAIN LAYERS FORMED OVER SOURCE AND DRAINS, SLOPING AWAY FROM THE GATE

(75) Inventor: Akira Nishiyama, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/798,924

(22) Filed: Mar. 6, 2001

(65) Prior Publication Data

US 2002/0008261 A1 Jan. 24, 2002

(30) Foreign Application Priority Data

Mar. 6, 2000 (JP) ........................................ 2000-060184

(51) Int. Cl.$^7$ .......................... H01L 29/78; H01L 29/43; H01L 21/28
(52) U.S. Cl. .......................... 257/377; 257/288; 257/382
(58) Field of Search ................................. 257/288, 192, 257/330, 332, 410–411, 377, 382, 383

(56) References Cited

U.S. PATENT DOCUMENTS

| | | | |
|---|---|---|---|
| 4,504,333 A | * 3/1985 | Kurosawa | ................ 257/397 |
| 6,137,149 A | * 10/2000 | Kodama | .................. 257/411 |
| 6,252,272 B1 | * 6/2001 | Watanabe et al. | ........... 257/288 |

FOREIGN PATENT DOCUMENTS

| | | | |
|---|---|---|---|
| JP | 07302757 A | * 11/1995 | |
| JP | 11-186546 | 7/1999 | |

OTHER PUBLICATIONS

Y. Nakahara, et al., Symposium on VLSI Technology Digest of Technical Papers, pp. 174–175, "Ultra–Shallow In–Situ–Doped Raised Source/Drain Structure for Sub–Tenth Micron CMOS", 1996.
Y. Mitani, et al., Symposium on VLSI Technology Digest of Technical Papers, pp. 176–177, "Buried Source and Drain (BSD) Structure for Ultra–Shallow Junction Using Selective Deposition of Highly Doped Amorphous Silicon", 1996.

* cited by examiner

Primary Examiner—Minh Loan Tran
Assistant Examiner—Thomas L Dickey
(74) Attorney, Agent, or Firm—Oblon, Spivak, McClelland, Maier & Neustadt, P.C.

(57) ABSTRACT

A semiconductor device having a low channel resistance without degrading transistor characteristics even for the 0.1 μm generation or later, and also: a manufacturing method of the device. The method includes fabricating source/drain electrodes and a gate electrode without using selective metal growth methods. Further, after forming the gate electrode, a semiconductor film is temporarily formed selectively in source/drain regions. A dielectric film is next deposited on the substrate and then, the surface is etched by chemical/mechanical polish (CMP) techniques to the extent that the semiconductor film is exposed on the surface. The semiconductor film is then partly etched until its midway portion along the thickness is removed. Thereafter, a desired metal or silicide is deposited on the entire surface. Next, CMP etching is performed to form electrodes, while letting the electrodes reside on or over the source/drain semiconductor layers and a gate insulation layer.

8 Claims, 11 Drawing Sheets

SUB-TENTH MICRON MISFET WITH SOURCE AND DRAIN LAYERS FORMED OVER SOURCE AND DRAINS, SLOPING AWAY FROM THE GATE

CROSS-REFERENCE TO A RELATED APPLICATION

This application is related to Japanese Patent Application No. P2000-060184, filed on Mar. 6, 2000, the entire contents of which are incorporated.

BACKGROUND OF THE INVENTION

1. Field of the Invention

The present invention relates generally to a transistor, semiconductor devices and a method of manufacturing semiconductors. More particularly, but not exclusively, the present invention relates to metal insulator semiconductor field effect transistor (MISFET) structures. This invention also relates to a method for manufacturing a MISFET.

2. Discussion of the Background

Modem semiconductor microfabrication technologies are developing in a way that makes field effect transistors (FETs) decrease in a minimum feature length. As FETs are miniaturized, gate lengths shrink to almost 0.1 micrometer ($\mu$m). This is because size reduction rules are established for achieving both a higher speed performance and a lower power consumption. The miniaturization per se results in a decrease in an occupation area of integrated circuit (IC) components, thus enabling more components to be mounted on a chip. This in turn permits achievement of very-large-scale integration (VLSI) or ultra large-scale integration (VLSI) chips with enhanced multifunctionalities.

Regrettably, it is predictable that the growth in microtechnologies will soon slowdown or stop due to a serious problem which occurs when the minimum feature sizes shrink to 0.1 $\mu$m. The problem is that simply miniaturizing IC components cannot lead to successful achievement of higher speed performance. This can be said because further feature size shrinkage results in an increase in parasitic resistances of IC components, which in turn makes it impossible or at least very difficult to increase electrical drivabilities thereof.

One known approach to avoiding this problem is to employ specially designed structures using self-aligned silicide or "saliside" techniques or other structures having additional metals as selectively deposited on the source/drain and gate of a FET.

For example, FIG. 26 shows a sectional view of a MISFET using the salicide scheme. This salicide MISFET has on a silicon substrate 1101, an insulated gate electrode 1103 formed thereover with a gate insulation film 1102 interposed between the gate 1103 and the substrate 1101. The gate 1103 has a gate insulation sidewall layer 1104 formed on its side surface. The silicon substrate 1101 has a drain region 1105 formed in its top surface, and a low-resistivity layer 1106 is buried in the drain 1105. The low-resistivity layer 106 is made of a silicide material as low in electrical resistivity as metals. The silicide layer 1106 is self-aligned with an outer vertical surface of the gate insulation sidewall 1104. Here, the drain 1105 is formed by diffusion of an impurity into the substrate 1101. In case the substrate 1101 has a "p" conductivity type, the drain 1105 is of an "n" type. The substrate 1101 and the drain 1105 form therebetween an interface 1200, at which a p-n junction is formed with a depletion layer interposed. The MISFET also has a source region, not shown, which is similar in structure to the drain region.

With the salicide MISFET, it is possible to reduce resistivities at the source/drain electrodes. Unfortunately, this advantage does not come without accompanying the following penalty. That is, a decrease in the distance between the pn junction 1200 and the silicide 1106 (to about 100 nanometers or less) results in degradation of a rectification in the pn junction, causing a leakage current to begin flowing therein. Once this problem occurs, dynamic random access memory (DRAM) chips employing salicide MISFETs of the type stated above are degraded in data storage retainability characteristics. Further, in logic IC chips, the power consumption can increase. In the worst case, any intended transistor operations are no longer obtainable.

When attempts are made to make the pn junction deeper to avoid the current leakage problem, another problem occurs: the so-called "short channel" effects take place causing transistor threshold potentials to decrease with value irregularities. In brief, to solve these conflicting or "trade-off" problems, the resistivities of the source/drain regions need to be reduced, while at the same time the pn junction needs to be as shallow as possible.

One known approach to lowering the source/drain resistivities while making the pn junction shallower is to employ "silicide mount" techniques. More specifically, the source/drain regions are fabricated by selective epitaxial growth (SEG) methods to have an increased thickness. Then, a silicide layer is formed on each of these regions, thereby virtually increasing the effective or "net" distance between the silicide and the pn junction.

One typical salicide-embedded FET structure formed in this way is depicted in cross-section in FIG. 27. This FET has a silicon substrate 1201 and a gate electrode 1203 formed thereover with a gate insulation film 1202 sandwiched between them. The gate electrode 1203 has a dielectric film 1204 (e.g., a gate insulation sidewall) on its sidewall. A drain region 1205 is formed by film growth techniques on the substrate surface. In addition, the drain region 1205 is laterally adjacent to the gate 1203 with the gate insulation sidewall 1204 interposed therebetween. The drain region 1205 has a silicide layer 1206 formed or "multilayered" on its top surface, and the substrate 1201 and the drain region 1205 are opposite in conductivity type to each other. One example is that the substrate 1201 has p conductivity type, whereas the drain region 1205 has n type. The substrate 1201 and the drain region 1205 form therebetween an interface 1200, at which a pn junction is defined with an associative depletion layer interposed. The FET also has its source region, which is similar in structure to the drain region 1205.

The FET structure of FIG. 27 is suitable for use as a highly miniaturized transistor of the next generation with its gate length of 0.1 $\mu$m or below. This can be said because the drain region 1205 may be microfabricated to a demonstrably increased thickness of about 0.1 $\mu$m as shown in FIG. 27. This makes it possible to increase the distance between the pn junction 1200 and the silicide 1206. Regrettably, as known to those skilled in the semiconductor device art, such distance increase along with its associated decrease in film thickness of the gate insulation sidewall 1204 results in an increase in resultant parasitic capacitance between the drain region 1205 and the gate electrode 1203. This parasitic capacitance increase causes a problem as to the unavailability of high-speed device performance required, which directly affects an operation speeds of LSIs.

Again, as far as "future" device's of the 0.1 μm feature size generation or later generations are concerned, it will be difficult to attain the required resistivity reduction of the source/drain regions or gate without degrading the other transistor characteristics (i.e., while simultaneously achieving short-channel effects with minimized risks of parasitic capacitance increase and at-the-pn-junction current leakage). Additionally, a decrease in channel resistivity due to transistor scaling merely permits further reduction of parasitic resistances.

It should also be noted that traditional salicide processes are performed using selective metal growth techniques. With such selective metal growth, however, very strict process conditions are required for obtaining higher selectivities, resulting in metals being partly formed from time to time on undesired portions of dielectric films. Unintentional metal formation on such "non-selected" films often results in electrical short-circuiting between the source/drain electrodes. Such electrical shorting also decreases the production yields of semiconductor devices. This problem is becoming more appreciable with a decrease in a minimum feature size of on-chip IC components due to an increase in the number of components per chip. Another problem faced with the selective metal growth methods is that metals employable for increasing selectivities relative to silicon are limited.

SUMMARY OF THE INVENTION

Accordingly, one object of the present invention is to solve the above-noted and other problems.

Another object of the present invention is to provide a transistor capable of achieving a channel resistivity phenomena without degrading transistor characteristics even for the 0.1 μm feature size generation or later generations, and also a method of making a semiconductor device having a sufficiently low contact resistivity at the source/drain and gate electrodes thereof.

Yet another object of the present invention to provide a method for manufacturing a semiconductor device capable of avoiding the use of selective metal growth techniques and permitting the use of any desired types of metals for the source/drain and gate electrodes.

To achieve these and other objects, the present invention provides a transistor including a semiconductor substrate, a gate insulation film formed on the semiconductor substrate, a gate electrode formed on the gate insulation film, and a channel region formed in the semiconductor substrate below the gate insulation film. Also included is a source region and a drain region formed to be spaced apart from each other in the semiconductor substrate and in which the channel region is between the source region and the drain region. Further, a source semiconductor layer is formed over the source region and has a concave portion at an upper portion thereof and an acute angle defined between a side face of the source semiconductor layer facing the gate electrode and a surface of the semiconductor substrate. A drain semiconductor layer is also formed over the drain region and has a concave portion at an upper portion thereof and an acute angle defined between a side face of the drain semiconductor layer facing the gate electrode and a surface of the semiconductor substrate. In addition, a source electrode is formed at the concave portion at the upper portion of the source semiconductor layer, and a drain electrode is formed at the concave portion at the upper portion of the drain semiconductor layer.

The present invention also provides a semiconductor device including an n-channel and a p-channel MISFET on a common semiconductor substrate. The n-channel and p-channel MISFETs have the concave portions and acute angles as discussed above.

Further, in one example of the present invention, the source electrode and the drain electrode of the n-channel MISFET include a different material from the source electrode and the drain electrode of the p-channel MISFET.

In another example of the present invention, the gate electrode of the n-channel MISFET includes a different material from the gate electrode of the p-channel MISFET.

The present invention also provides a method of manufacturing a semiconductor device, which includes forming a first dielectric film on a semiconductor substrate, depositing a first semiconductor layer on the first dielectric film, patterning the first dielectric film and the first semiconductor layer, forming second semiconductor layers of first and second conductivity types on a principal surface of the semiconductor substrate, and depositing a second dielectric film on the first dielectric film and the first semiconductor layer plus the second semiconductor layers. The method also includes removing the second dielectric film until upper faces of the first semiconductor layer and the second semiconductor layers appear, removing the first semiconductor layer and the second semiconductor layers while letting at least part of the second semiconductor layers reside, and depositing a metal or silicide on the second semiconductor layers.

In addition, a gas or vapor phase growth of the second semiconductor layers makes it possible to form a facet on the side face opposing the gate electrode. At this time, it is possible to adjust the inclination or gradient of this facet by selection of the growth surface of the semiconductor substrate at an appropriate crystal plane orientation.

Another advantage lies in an ability to reduce the parasitic resistance without having to negatively effect the remaining transistor characteristics (such as short-channel effect, parasitic capacitance increase, and at-the-pn-junction current leakage).

The present invention also provides a technique for fabricating the source/drain and gate electrodes by a method including the steps of first forming recess portions, forming a metal on the overall surface, and then let this be subject to etch-back processing. This fabrication method no longer requires the use of traditional selective metal growth processes. Accordingly, the resultant device structure is free from risks of electrical shorting between the source and drain electrodes without depending on selective growth abilities of metals used. Thus, it is possible to improve manufacturing yields.

BRIEF DESCRIPTION OF THE DRAWINGS

Various other objects, features and attendant advantages of the present invention will be more fully appreciated as the same becomes better understood from the following detailed description when considered in connection with the accompanying drawings, wherein.

DETAILED DESCRIPTION OF THE INVENTION

Figure 1:
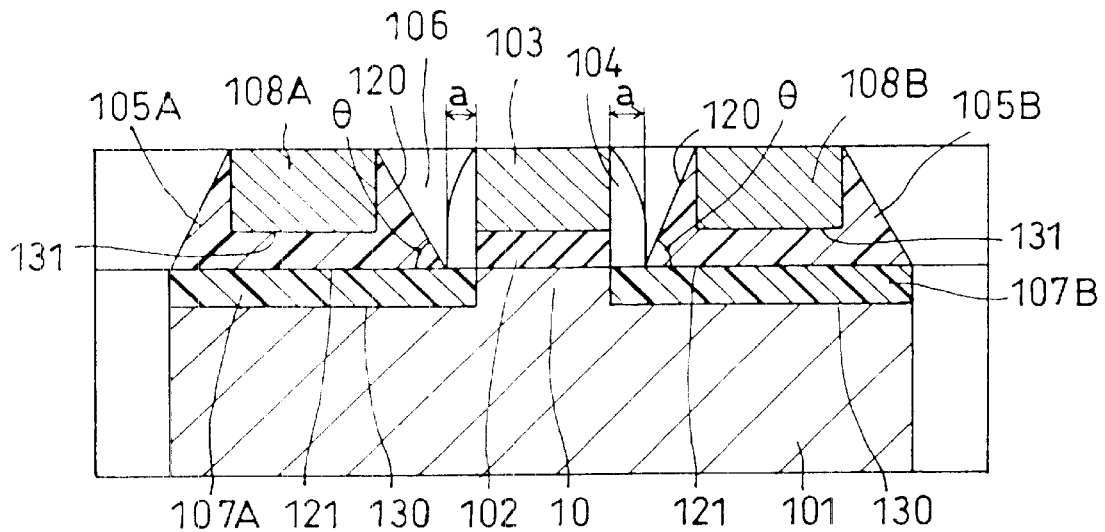
FIG. 1 is a diagram showing a sectional view of a semiconductor device having two transistors in accordance with one preferred aspect of the present invention.

Referring now to the drawings, wherein like reference numerals designate identical or corresponding parts throughout the several views, the present invention will be described.

Referring first to FIG. 1, there is shown in cross-section a metal insulator semiconductor field effect transistor (MISFET) in accordance with one aspect of the present invention.

As shown in FIG. 1, the MISFET is formed on a top surface of a semiconductor substrate 101, which is typically made of silicon. The MISFET has a gate insulation film 102 on the surface of the semiconductor substrate 101. Further, the gate insulation film 102 is made of silicon oxide or the like. The MISFET also has a gate electrode 103 on the gate insulation film 102, and has a pair of a heavily-doped source region 107A and a drain region 107B formed in the semiconductor substrate 101. The source region 107A and the drain region 107B are laterally spaced apart from each other. In addition, the MISFIT has a channel region 10 defined between the source region 107A and the drain region 107B, and the gate electrode 103 substantially overlies the channel region. In other words, the source region 107A and the drain regions 107B are located in the semiconductor substrate 101 on relatively opposite sides of the gate electrode 103.

The MISFET further includes a source semiconductor layer 105A on the source region 107A and a drain semiconductor layer 105B on the drain semiconductor region 107B. The source semiconductor layer 105A and the drain semiconductor layer 105B have a concave portion at an upper portion thereof, respectively. The MISFET also has a source electrode 108A at the concave portion at the upper portion of the source semiconductor layer 105A and a drain electrode 108B at the concave potion at the upper portion of the drain semiconductor layer 105B. Note that in the rest of the description, the suffices "A" and "B" on the reference numbers will not always be used to indicate respective independent parts so as to simplify the discussion.

A novel structural feature of the MISFET structure shown in FIG. 1 is that at an angle θ defined between a side face 120 of the source semiconductor layer 105A facing the gate electrode 103 and a surface 121 of the semiconductor substrate 101 forms an acute angle, and an angle θ defined between a side face 120 of the drain semiconductor layer 105B facing the gate electrode 103 and a surface 121 of the semiconductor substrate 101 forms an acute angle. The source semiconductor 105A and the drain semiconductor layer 105B are each designed to generally have a trapezoid cross-section with slanted side faces. More specifically, the source/drain semiconductor layers 105 have a slanted or "sloped" sidewall 120 on its one side face opposing a corresponding vertical sidewall of the gate electrode 103, with an acute angle θ defined between the sidewall 120 and the surface 121 of the semiconductor substrate 101.

The transistor includes the source electrode 108A formed at the concave portion at the upper portion of the source semiconductor layer 105A, and the drain electrode 108B formed at the concave portion at the upper portion of the drain semiconductor layer 105B. Further, the top surfaces of the source semiconductor layer 105A and the drain semiconductor layer 105B have a recess portion with the source electrode 108A and the drain electrode 108B buried therein, respectively.

In addition, the reference numeral "106" is used to designate an interlayer dielectric (ILD) film, and the reference numeral 104 denotes a gate sidewall, which is made of a chosen dielectric material for electrical isolation of the gate sidewall. Further, the source/drain semiconductor layers 105 are spaced apart by a gate sidewall 104 from the gate insulation film 102 by a specified distance corresponding to the film thickness "a" of the gate sidewall 104. With such an arrangement, it is possible to preclude the flow of a leakage current between the source/drain semiconductor layers 105 and the gate electrode 103.

This MISFET is such that the acute angle θ defined between the side face 120 of each of the source/drain semiconductor layers 105 facing the gate electrode 103 and the surface 121 of the semiconductor substrate 101 as shown in FIG. 1, causes the source/drain semiconductor layers 105 to be spaced by an increased distance from the gate electrode 103. Thus, it is possible to reduce parasitic capacitances.

Preferably, this acute angle θ is set at 10° or greater to reduce the parasitic capacitance. More preferably, this angle θ is 20° or greater. In addition, to lower parasitic capacitances, the angle is preferably lower than or equal to 80°. More preferably, the angle is less than or equal to 70°.

In addition, the recess portions are formed at the upper portion of the source/drain semiconductor layers 105. The recesses are respectively buried with the source and drain electrodes 108. Accordingly, the resulting contact areas of the source/drain electrodes 108 and the source/drain semiconductor layers 105 may be made larger. This makes it possible to reduce contact resistivities.

In addition, the source/drain regions 107 are shallowly formed with the source/drain semiconductor layers 105 formed thereon. Thus, the distance between the pn junction face 130 and the source/drain electrodes 108 is made longer.

Accordingly, the pn junction is shallow enough to preclude occurrence of any short-channel effects. In addition, the pn junction is free from risks of degradation of current leakage characteristics due to metal deposition.

It should be noted that the MISFET shown in FIG. 1 is such that the source/drain semiconductor layers 105 are partly removed by anisotropic etching techniques such as reactive ion etching (RIE) or the like to bury or embed the source/drain electrodes 108. Thus, the resultant structure is such that the side face where each of the source/drain semiconductor layers 105 is in contact with its corresponding source/drain electrodes 108 is substantially vertically etched.

Figure 2:
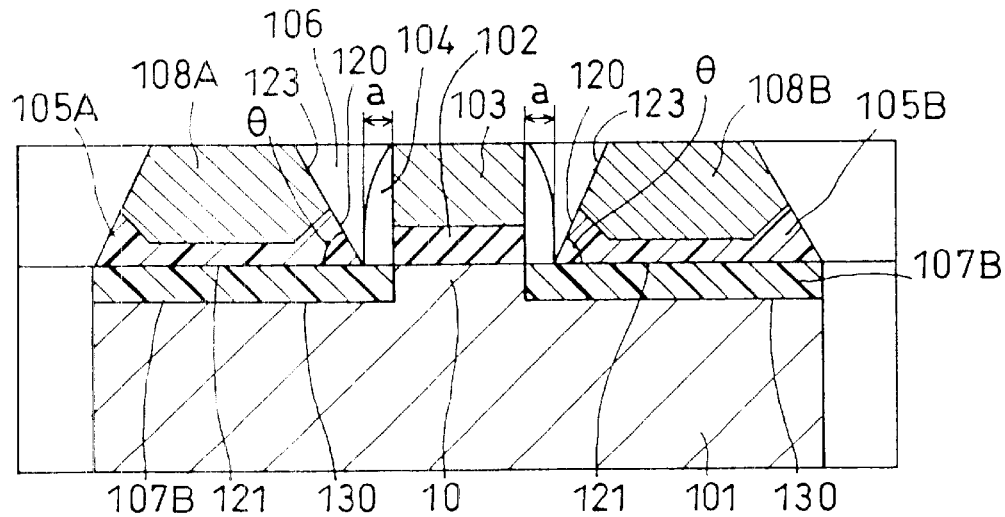
FIG. 2 is a diagram showing a sectional view of a semiconductor device having two transistors in accordance with another aspect of the present invention.

Another MISFET is shown in FIG. 2, which is similar to that of FIG. 1, except that the source/drain semiconductor layers 105 are removed by isotropic etch techniques such as plasma etching or the like. The use of such isotropic etching permits the source/drain semiconductor layers 105 to be etched isotropically causing the recess portions formed at the upper portions of source/drain semiconductor layers 105 to each have a "U"-like cross-section. Additionally, the angle θ between the side face 120 of each source/drain semiconductor layer 105 facing the gate electrode 103 and the surface 121 of the semiconductor substrate 101 is an acute angle. The source/drain electrodes 108 are buried within the recesses of the source/drain semiconductor layers 105, respectively, and are formed so that the source/drain electrodes 108 overlay the source/drain semiconductor layers 105. In addition, a side face 123 of each of the source/drain electrodes 108 facing the gate electrode 103 has a same angle of the acute angle θ defined between the side face 123 and the surface 121 of the semiconductor substrate 101. Further, the side faces 120 and 123 are flush with each other, thus forming a "seamless" flat surface.

As the acute angle defined between the side face of each of the source/drain semiconductor layers 105 facing the gate electrode 103 and the surface 121 of the semiconductor substrate 101 is set at the acute angle θ, it is possible to increase the "net" distance between the source/drain semiconductor layers 105 and the gate electrode 103, and also set the distance between source/drain electrodes 108 and the gate electrode 103, thereby enabling reduction of parasitic capacitances.

Note that in the MISFET shown in FIG. 2, the same parts are designated by the same reference characters as in FIG. 1, and accordingly explanations thereof are omitted.

In addition, in the case of the MISFET shown in FIG. 2, recess portions (concave portions) are formed at the upper portions of the source/drain semiconductor layers 105 and the source/drain electrodes 108 are buried in the recesses. Thus, it is possible to increase the resulting contact areas of the source/drain electrodes 108 and the source/drain semiconductor layers 105. This in turn makes it possible to reduce contact resistivities thereof.

In addition, the source/drain regions 107 are shallowly formed with the source/drain semiconductor layers 105 formed thereon. Thus, the distance between the pn junction plane 130 and the source/drain electrodes 108 is made longer.

Accordingly, the pn junction is shallow enough to prevent occurrence of short-channel effects, and is free from any risks of degradation of leakage current characteristics due to metal deposition.

Figure 26:
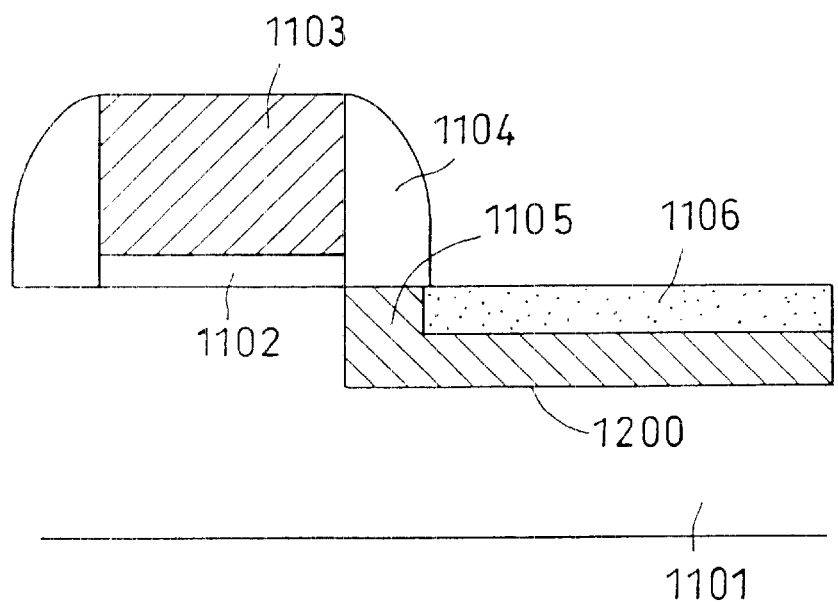
FIGS. 26–27 are diagrams each showing a sectional view of a background art semiconductor device.
Figure 27:
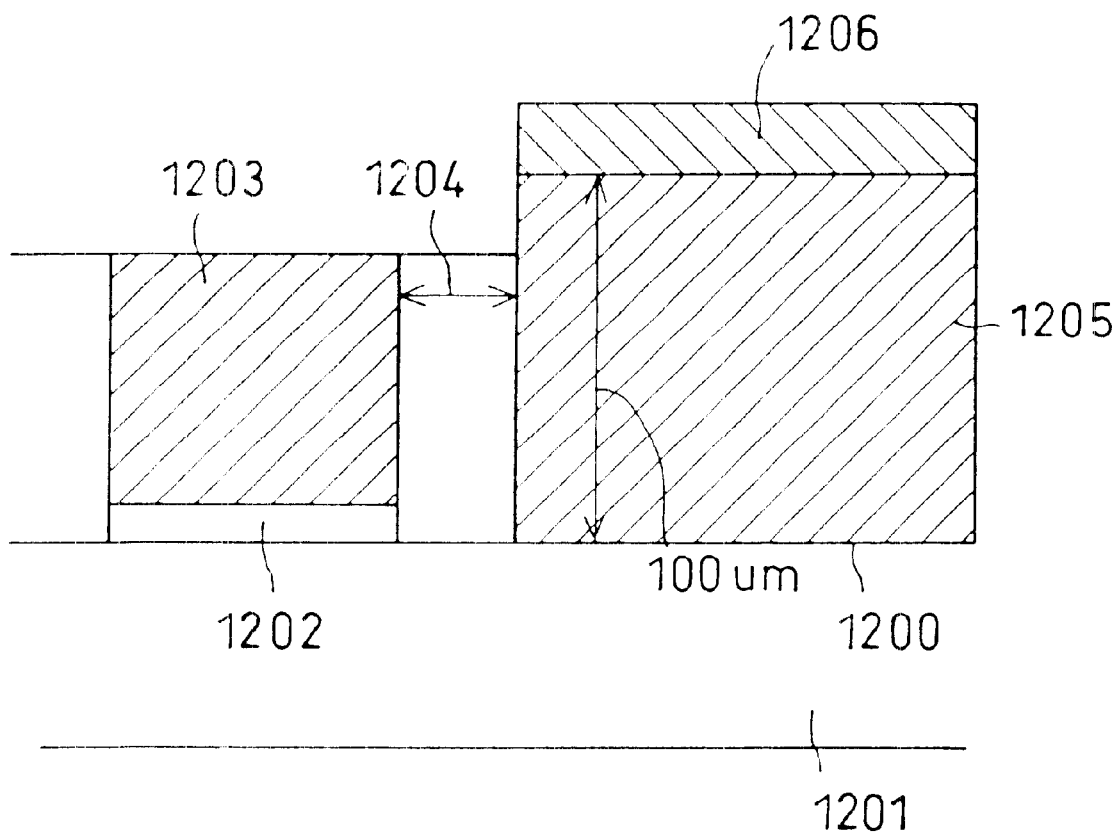

Presented below are the device-inherent parasitic capacitance Ctot, parasitic resistance Rsd and gate delay time Tpd of a respective one of (1) the field effect transistors shown in FIGS. 1–2, (2) the field effect transistor formed by the salicide process as shown in FIG. 26, and (3) a field effect transistor with an elevated source/drain structure formed by a salicide process as shown in FIG. 27:

(1) Ctot[fF/μm]=5.9 Rsd[ohm(S/D)]=120 Tpd[ps]=5.5
(2) Ctot[fF/μm]=5.1 Rsd[ohm(S/D)]=440 Tpd[ps]=7.3
(3) Ctot[fF/μm]=11.1 Rsd[ohm(S/D)]=200 Tpd[ps]=11.5

As apparent from the above-values, with the transistor (2), the parasitic capacitance is reduced in value whereas the parasitic resistance is increased. On the contrary, with the transistor (3), the parasitic resistance is small whereas the parasitic capacitance is large. On the contrary, with the transistor (1), the parasitic capacitance and the parasitic resistance are both reduced in value. Regarding the gate delay time, it can be seen that the transistors according to the present invention are shorter than the transistors (2) and (3).

Very importantly, the present aspect offers an increased effectivity when it is applied to certain transistors with the gate insulation film being formed of a metal oxide film having a high dielectricity, such as $TiO_2$ or the like. This can be said because the use of such high-dielectricity metal oxide film results in an increase in gate film thickness in most cases. This in turn causes the side face of source/drain semiconductor layer to increase in contact area with its associated gate film, leading to establishment of a tendency to increase in parasitic capacitance. However, with the present aspect, since the source/drain semiconductor layer's side face is specifically designed to fall within the above-discussed angular region, the resulting contact with respect to the gate insulation film decreases in area, thus enabling reduction of the parasitic capacitance.

An explanation will next be given of a method for manufacturing the semiconductor device of this invention with reference to FIGS. 3 through 10.

Figure 3:
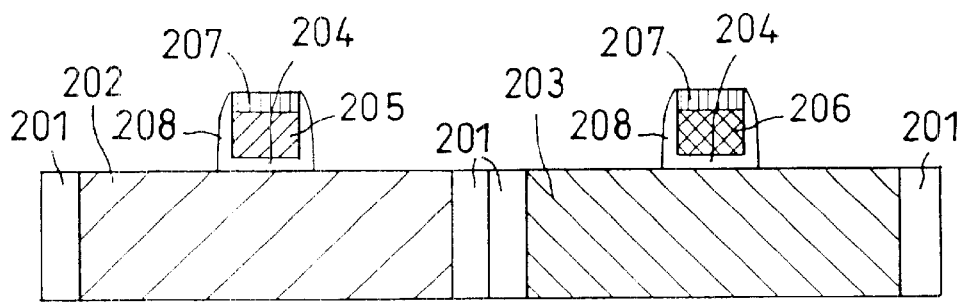
FIGS. 3 through 10 illustrate in cross-section some major process steps in the manufacture of the semiconductor device according to the present invention.

First, as shown in FIG. 3, for fabricating element isolation regions 201 on the principal surface of a silicon (Si) substrate (semiconductor substrate), the Si substrate is etched to form grooves for shallow trench isolation (STI) to a depth of approximately 0.4 μm. Thereafter, a layer of $SiO_2$ is deposited on the entire surface by chemical vapor deposition (CVD) techniques. Then, chemical/mechanical polishing (CMP) is applied to thereby planarnize the entire surface. In FIG. 3, the lower part of the substrate which is deeper than the STI grooves 201 is eliminated from the illustration as it has no direct relationship with the explanation of the present invention. The same is true with the rest of the attached drawings enclosed herewith.

Then, selected portions of the substrate corresponding to a p-channel transistor formation region and an n-channel transistor formation region are masked by a photolithography process. Thereafter, ion implantation is performed to form an n-type well region 203 and a p-type well region 202, respectively.

To adjust the threshold voltage values of such transistors, ion implantation is done at respective channel regions.

In addition, a $TiO_2$ film 204, which will become a gate insulation film (first dielectric film), is deposited on the entire surface of the Si substrate (semiconductor substrate) to a thickness of about 20 nanometers (nm), while a mixture gas of tetraisopropyl titanate (TPT) ($Ti(OC_3H_7)_4$) and oxygen react at a temperature of 380° C.

Next, a layer of polycrystalline silicon or "poly-Si" (first semiconductor layer) is deposited on the entire surface of the gate insulation film 204 to a thickness of 50 about nm. The poly-Si layer may be fabricated by the CVD or sputter techniques.

After masking the p-channel formation region and the n-channel formation region using a photolithography process, a chosen impurity (e.g., phosphorus (P ) or boron (B)) is doped by ion implantation techniques at various energies to a dose of about $1 \times 10^{15}$ $cm^{-2}$.

A $SiO_2$ film 207 is then deposited on the entire surface to a thickness of about 20 nm. Either one of the CVD and sputter techniques may be used.

Further, the impurity doped in the poly-Si is activated through annealing (in a $N_2$ gas at 800° C. for thirty minutes), thereby forming a heavily-doped n ($n^+$) type Si gate electrode 205 and a $p^+$-type Si gate electrode 206 over the n-channel and p-channel formation regions, respectively.

Next, reactive ion etching (RIEI) techniques are used to etch the gate insulation film (first dielectric film) 204 and poly-Si gate electrodes 205, 206 plus the $SiO_2$ film 207 into gate shapes.

After depositing a $SiO_2$ film on the entire surface by CVD techniques to a thickness of about 10 nm, gate sidewalls 208 are fabricated by an RIE process on side faces of the gate electrodes (first semiconductor layers) 205, 206. The gate sidewalls 208 each have a thickness of about 10 nm, as measured from a corresponding side face of the gate electrodes 205, 206.

Figure 4:
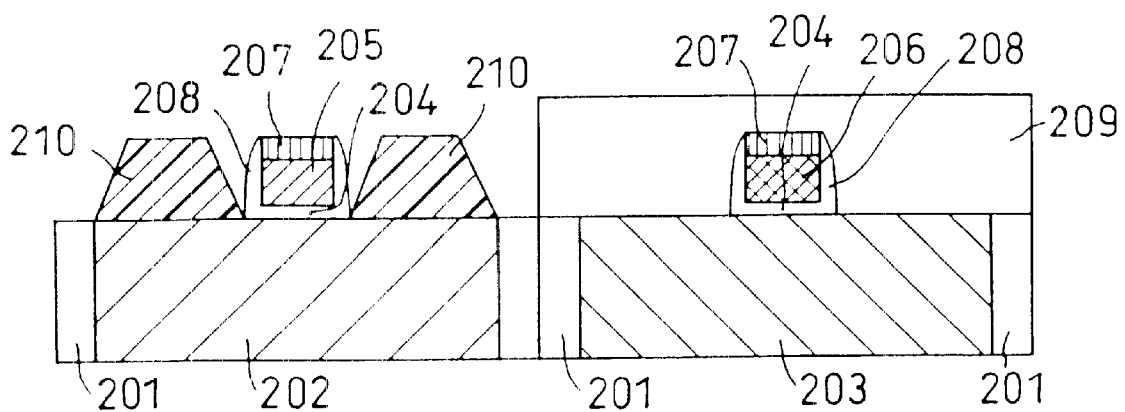

As shown in FIG. 4, a SiN film is deposited on the entire surface to a thickness of about 50 nm. Thereafter, a photolithography process is used to perform etching, thereby causing the SiN film 209 to reside only at a selected part overlying the p-channel transistor formation region.

Next, through gas or vapor phase growth in a mixture gas of $SiH_4$, $PH_3$ and HCl at 600° C., Si source/drain semiconductor layers (second semiconductor layers of a first conductivity type) 210 containing a phosphorus impurity with a doping concentration of $1 \times 10^{20}$ cm$^{-3}$ are selectively deposited only at an exposed portion (n-channel transistor formation region) of the semiconductor substrate to a thickness of about 70 nm. In this case, since the $SiO_2$ film 207 is present on the gate electrode 205, any Si layer is hardly deposited. Thus, the resulting poly-Si gate electrode 205 and the Si source/drain semiconductor layers 210 are substantially flush with each other on the top surfaces thereof.

In addition, setting a deposition temperature to be 600° C. or more results in the deposited Si source/drain semiconductor layers 210 being single-crystals. Thus, a specified face of the individual one of source/drain semiconductor layers 210 opposing the gate sidewall 208 becomes a {111} or {311} plane or orientation, thus forming a facet. While the crystal plane orientation of this facet is variable depending upon the fabrication conditions, process control is performed to ensure that an angle between the side face of the Si source/drain semiconductor layer 210 and the surface of the semiconductor substrate becomes an acute angle. Thereafter, the SiN film 209 overlying the p-channel transistor formation region is removed by use of a "hot" phosphoric acid or alternatively by dry etching techniques.

Figure 5:
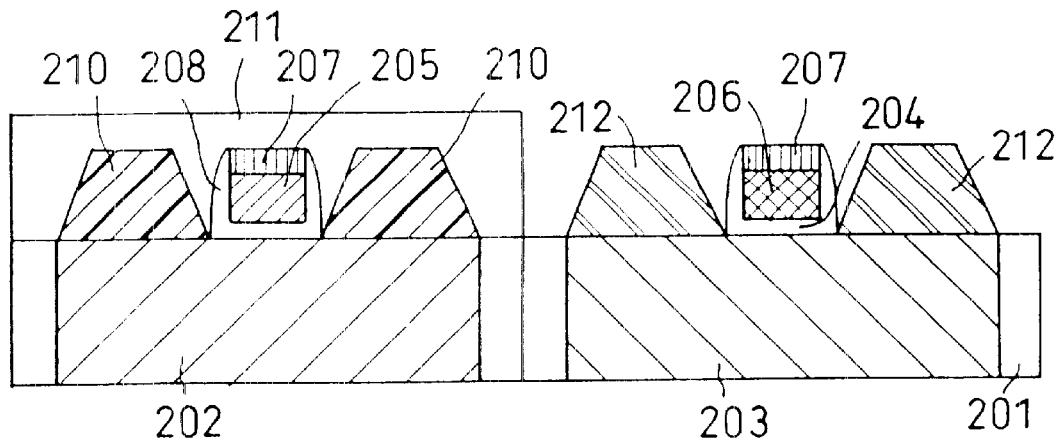

As shown in FIG. 5, after depositing a SiN film on the overall surface to a thickness of about 50 nm, a photolithography process is used to perform etching, thereby causing the SiN film 211 to reside only at selected part overlying the n-channel transistor formation region.

Through vapor phase growth in a mixture gas of $SiH_4$ and $B_2H_6$ plus HCl at 600° C., Si source/drain semiconductor layers (second semiconductor layers of a second conductivity type) 212 containing a boron (B) impurity with a concentration of $1 \times 10^{20}$ cm$^{-3}$ are selectively deposited only at an exposed portion (a p-channel transistor formation region) of the semiconductor substrate to a thickness of about 70 nm. In this case, since the $SiO_2$ film 207 is present on the gate electrode 206, any Si layer is never deposited. Thus, the resulting poly-Si gate electrode 206 and the Si source/drain semiconductor layers 212 are substantially flush with each other on the top surfaces thereof.

Note here that setting the deposition temperature at 600° C. or higher results in the deposited Si source/drain semiconductor layers 212 being single-crystals. Thus, a specified face of the individual one of the source/drain semiconductor layers 212 facing the gate sidewall 208 becomes a {111} or {311} plane, thus forming a facet. While the crystal plane orientation of this facet depends on the fabrication conditions, process control is performed to ensure that an angle between the side face of the source/drain semiconductor layer 212 and the surface of the semiconductor substrate becomes an acute angle. Thereafter, the SiN film 211 overlying the n-channel transistor formation region is removed using a hot phosphoric acid or alternatively by dry etch techniques.

Figure 6:
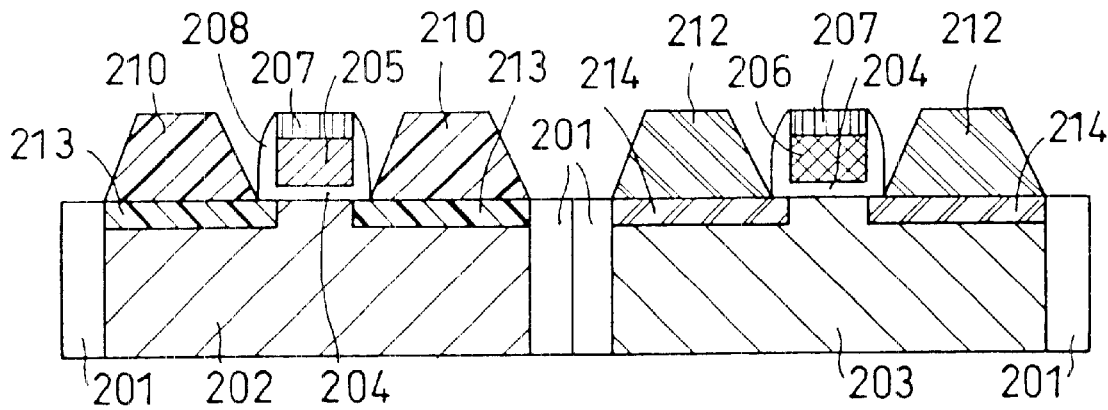

As shown in FIG. 6, thermal processing is performed in an argon (Ar) gas at 600° C. for sixty minutes, causing the doped phosphorus impurity to out diffuse into the semiconductor substrate through the n-type Si source/drain semiconductors 210, while at the same time letting the boron (B) impurity diffuse into the substrate via the p-type Si source/drain semiconductors 212 to thereby form n-type source/drain regions 213 and p-type source/drain regions 214, respectively. The source/drain regions 213, 214 are very shallow in the semiconductor substrate to the extent that each has a reduced depth ranging from about 10 to 20 nm. This makes it possible to sufficiently suppress short-channel effects of transistors thus fabricated.

Figure 7:
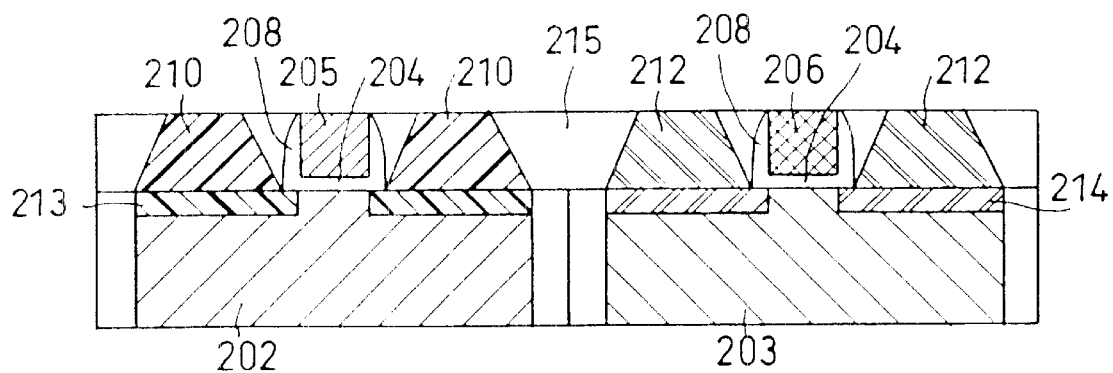

As shown in FIG. 7, a $SiO_2$ film (second dielectric film) 215 is deposited on the entire surface to a thickness of 100 nm. Thereafter, chemical/mechanical polishing (CMP) methods are used to remove an upper portion of the $SiO_2$ film 215 to the extent that top surfaces of the gate electrodes (first semiconductor layers) 205–206 and the source/drain semiconductor layers (second semiconductor layers) 210, 212 are exposed both in the n-channel transistor formation region and in the p-channel transistor formation region.

Figure 8:
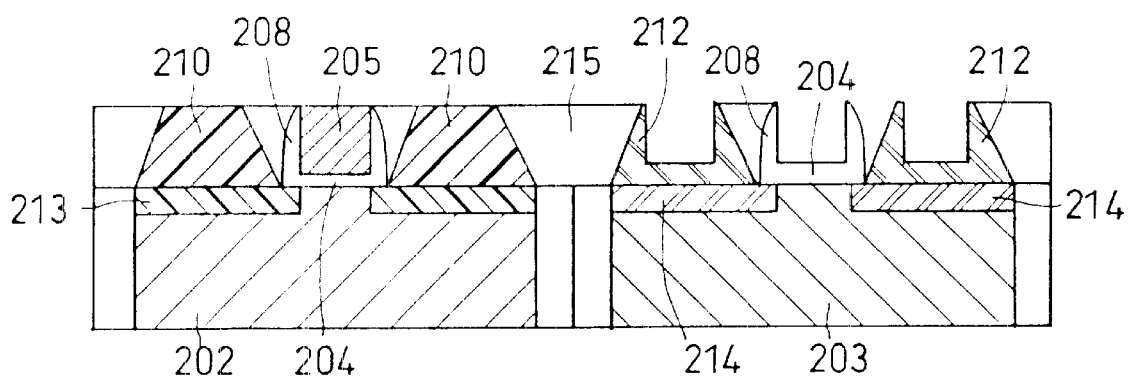

As shown in FIG. 8, after forming a resist film (not shown) overlying only the n-channel transistor formation region by using a photolithography process, etching is performed by an RIE process on a specified part of the source/drain semiconductor layers (second semiconductor layers) 212 and the Si gate electrode (first semiconductor layer) 206.

At this process step, careful attention should be taken to ensure that whereas the poly-Si layer 206 at the gate section is entirely removed, the single-crystalline Si of the source/drain semiconductor layers 212 is etched in such a way that it partly resides on the bottom surface thereof.

The end point of this etching is readily detectable because an etching gas used is mixed with titanium (Ti) compounds, such as $TiF_X$, $TiCl_X$. These Ti compounds are producible from the gate insulation film 204. In this example, etching is ideally done until the bottom is at a prespecified level, which is higher by about 20 nm than the "original" surfaces of the source/drain regions 214. Thereafter, the resist film used is removed permitting only the etched portions to reside so that each has a recess-like sectional shape.

Figure 9:
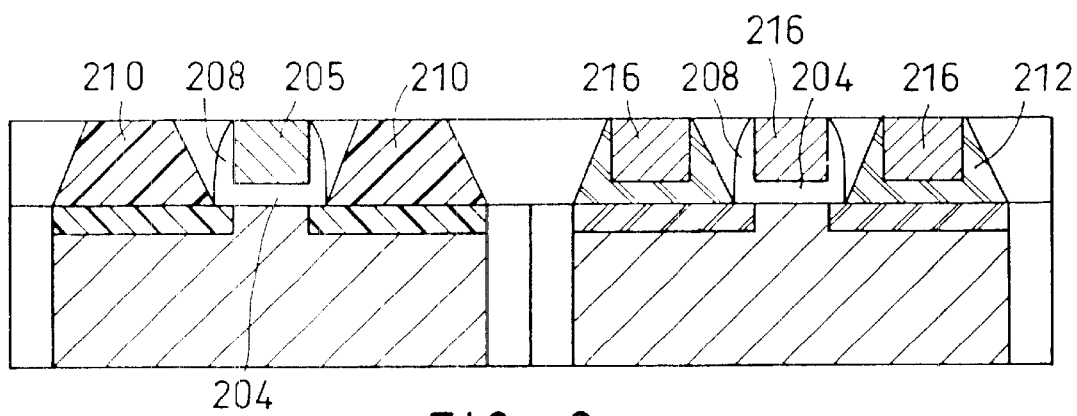

As shown in FIG. 9, a layer of chosen conductive material for use as source/drain and gate electrodes is deposited on the entire surface. The material may be metals or silicides, or in particular those materials low in Schottky barrier height (SBH) relative to p-type Si such as Pt, PtSi, or Pd. This deposition may be performed by any one of the CVD, sputter and other known entire-surface deposition methods.

Next, entire-surface etching is performed by CMP techniques until the $SiO_2$ film 215 is detected to thereby form the required electrodes in recesses thus defined in the gate insulation film 204. More specifically, a gate electrode 216 is formed in a recess in the top surface of gate insulation film 204, whereas source/drain electrodes (metals or silicides) 216 are formed in recesses of the source/drain semiconductor layers (second semiconductor layers) 212.

Figure 10:
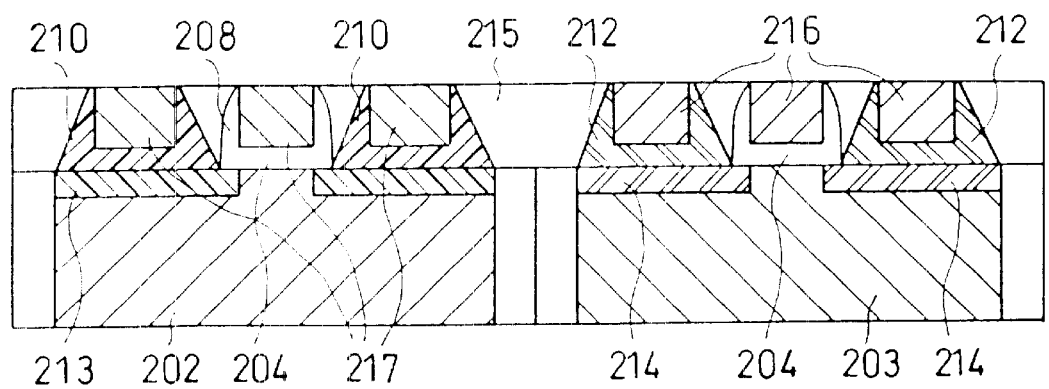

As shown in FIG. 10, after forming a resist film (not shown) by a photolithography process only at a selected portion overlying the p-channel transistor, part of the source/drain semiconductor layers (second semiconductor layers) 210 and the Si gate electrode (first semiconductor layer) 205 are etched by RIE methods.

At this process step, careful attention should be paid to the fact that the poly-Si layer 205 at the gate section is entirely removed, whereas the single-crystalline Si of the source/drain semiconductor layers 210 is etched in such a way that it partly resides on the bottom surface thereof.

The end point of this etching is readily detectable because an etching gas used is mixed with titanium (Ti) compounds such as $TiF_X$, $TiCl_X$. In this example, etching is ideally done until the bottom is at a prespecified level, which is higher by about 20 nm than the "original" surfaces of the sources/drain regions 213. Thereafter, the resist film is removed permitting only the etched portions to reside so that each has a recess-like sectional shape.

Next, a layer of chosen conductive material for use as source/drain and gate electrodes is deposited on the entire surface. The material may be metals or silicides, or in particular materials low in Schottky barrier height (SBH) relative to n-type Si such as ErSi$_2$. This deposition may be performed by any one of the CVD, sputter and other known entire-surface deposition methods.

Next, entire-surface etching is done by CMP techniques until the SiO$_2$ film 215 is detected. In this way, the source/drain electrodes (metals or silicides) 217 are formed in the recesses in the second semiconductor layers 210. At this time, a gate electrode 216 is formed simultaneously in a recess which is defined in the top surface of the gate insulation film 204.

Next, a SiO$_2$ film (not shown) is entirely deposited and is then selectively etched forming therein contact holes (not shown) to form electrical interconnection wires or on chip leads (not shown), thereby forming an LSI.

Although in this aspect, the gate insulation film 204 is exemplarily made of TiO$_2$ with a high dielectricity, this material may be replaced with other similar suitable materials including, but not limited to, Ta$_2$O$_5$, Al$_2$O$_3$, Y$_2$O$_3$, ZrO$_2$, and (Ba, Sr)TiO$_3$.

In addition, although the TiO$_2$ gate insulation film 204 is formed by metal-organic CVD (MOCVD) techniques, this film may alternatively be formed by sputtering.

Optionally, during depositing the TiO$_2$ gate insulation film, a xenon (Xe) lamp of 200 watts (W) may be used. The Xe lamp is operated to emit near-ultraviolet rays with a wavelength of 300 nm, which travels through a window of deposition equipment to fall onto the entire surface of a wafer (semiconductor substrate). This lamp is rendered operative prior to the flow of a deposition gas and is continuously activated until termination of the intended deposition process. With such an arrangement, it is possible to preclude an unwanted mixture of carbon (C) and/or proton (H) coming from organic source gases used, which in turn makes it possible to deposit a film having its composition be almost completely TiO$_2$.

Additionally, the raw material gas used for the MOCVD process is not limited only to the gas with the above-noted combination, and may also be a mixture gas of ethyltitanate (TET) (Ti(OC$_2$H$_5$)$_4$) or titanium-tetrakis-isopropoxide (TTIP) and oxygen. In the case of TTIP, the TiO$_2$ is fabricatable without a mixture of oxygen. Still alternatively, the organic source may be replaced by an inorganic source such as TiCl$_4$. If this is the case, it is desirable that the reaction temperature be made a little higher, for example, to 600° C. or more or less.

Further, the gate insulation film 204 may not always be formed of the above-noted high dielectricity film and may alternatively be made of SiO$_2$ or SiN. In addition, the gate insulation film 204 does not necessarily make use of the first deposited dielectric film. One example is that after having removed the poly-Si 206 of the gate section at the process step of FIG. 8, the dielectric film 204 is temporarily removed and thereafter another material (such as SiO$_2$, SiN, a high-dielectricity film, a ferroelectric film or the like) is newly deposited for use as the gate insulation film.

Obviously, at this time, part of the gate insulation film 204 may be left. For instance, at the step of FIG. 8, in case the source/drain semiconductor layers 212 are required to be left on the source/drain regions 214 to a thickness of 40 nm rather than 20 nm, the end point of the etching treatment is detectable by setting the thickness of TiO$_2$ film at 40 nm. In some cases this 40-nm thickness is too thick to the gate insulation film 204. In such cases, an additional etch process is performed to reduce the film thickness to 20 nm.

Where necessary, a TiN layer may be formed on the TiO$_2$ gate insulation film 204 for preventing a chemical reaction between the gate insulation film 204 and its associated gate material, for example.

Figure 11:
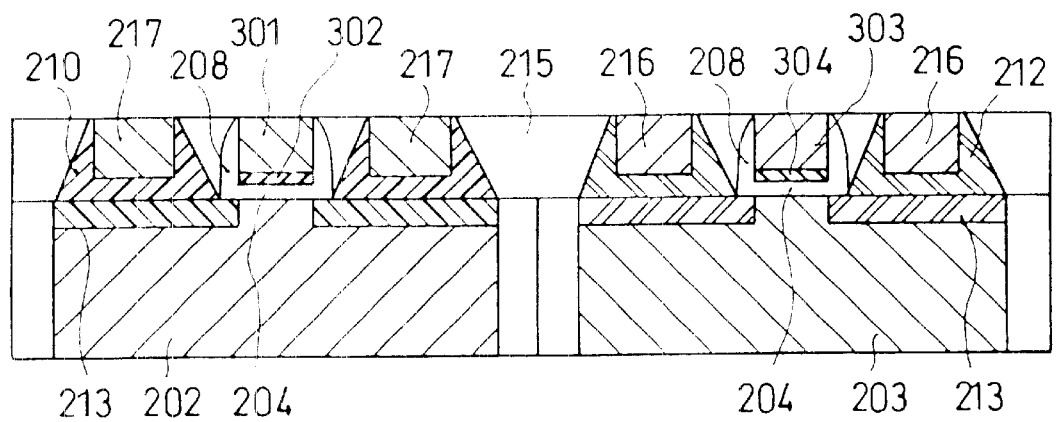
FIG. 11 depicts in cross-section a semiconductor device in accordance with a further aspect of the present invention.

Further, the etching at the step of FIG. 8 may not always be designed to entirely remove the poly-Si 206 of the gate section. In this case, as shown in FIG. 11, the gate electrode has a multilayer structure essentially including metals 301, 303 and poly-Si 302, 304. Thus, it is possible to achieve the surface channel configuration of an n-channel transistor using n-type Si and a p-channel transistor using p-type Si, while simultaneously permitting the gate electrode to offer low resistivity due to the presence of such metals. Obviously, in this case, the metals installed at n and p may be set at work functions in a way independent from each other. Thus, it is possible to minimize contact resistivities between the poly-Si 302, 304 and the metals 301, 303.

On the other hand, in case the poly-Si 206 is entirely removed at the step of FIG. 8, the poly-Si layers 205–206 containing different impurities may be designed to contain a single type of impurity (e.g., phosphorus-diffused poly-Si) or alternatively be designed to not contain impurities. However, in this case, it is difficult at the etching step of FIG. 8 to control at the same rate as that of impurity-doped Si. In view of this, it is desirable that the layers contain the same impurity.

In addition, the single-crystal Si layers 210, 212 deposited by the selective epitaxial growth (SEG) process are not limited only to the scheme for doping into CVD. For example, at the process step of FIG. 4, "pure" single-crystal Si containing no impurities is selectively pre-deposited at Si exposure portions of the n-channel transistor formation region and the p-channel transistor formation region, and thereafter ion implantation is performed to thereby form the individual impurity-containing portion(s). This ion implantation may be performed immediately after fabricating the single-crystal Si, or alternatively after completing the CMP process of the dielectric film 215 as shown in FIG. 7. Note here that because the presence of point defects occurring due to ion implantation makes the impurity diffusion control difficult at later steps, it is impossible to precisely control the pn junction to fall within a range of 10 to 20 nm in the substrate. Accordingly, CVD simultaneous doping methods are considered more preferable.

Obviously, in CVD-based dope methods, the impurity amount may not be uniform in a direction along the thickness of Si. One example of possible variations is that the impurity concentration is higher at part near the Si substrate and lower at part distant far therefrom.

Further, the pn junctions in the n-channel transistor formation region and the p-channel transistor formation region may be preformed by ion implantation prior to the deposition of the single-crystal Si.

During selective deposition of single-crystal Si, in order to retain its selectivity higher, it is desirable that H$_2$ annealing or vacuum annealing within the CVD apparatus is performed at close to 800° C., for example, to remove any residual natural oxide films on the exposed Si surfaces, thus enabling a Si with excellent crystallinity to be reliably fabricated on or over Si.

The crystallinity of single-crystal Si thus deposited might affect the reproducibility of etch treatment at the FIG. 8 step and also influence the characteristics of IC components in the form of reproducibility of metal contact resistivities.

Although the dielectric films 208 on the gate side faces formed prior to selective CVD fabrication of the source/drain semiconductor layers 210, 212 are formed by CVD and RIE processes, these may alternatively be formed through oxidation or nitridation of the semiconductor layers 205, 206.

When the need arises, it is also possible the dielectric films 208 on gate side faces may be eliminated while causing the gate insulation film 204 to be used to electrically isolate the semiconductor layers 205, 206 and the source/drain semiconductor layers 210, 212. For example, the intended isolation may be attained by using the dielectric layer 106.

The materials 209, 211 used as the masks during SEG processes may not be limited only to SiN and may be replaced with carbon films or any other similar suitable materials which offer enhanced selective removabilities with respect to $SiO_2$ and Si. Note, however, that in the case of employing carbon films, a need arises to use wet processing (e.g., using a mixture liquid of a sulfuric acid and a hydrogen peroxide water), because the ordinary masking techniques cannot be used for removing resist films used during carbon film etching processes. It is apparent to those skilled in the semiconductor art that in case the masks 209, 211 are formed of carbon films, it is possible to remove them by ashing techniques. Obviously, the carbon films as discussed herein are mere representative ones capable of being easily removed through ashing. The mask films are replaceable by other carbon-containing materials that also contain other elements, such as Si or Ge or the like in addition to carbon as the main component thereof.

Although the metallic materials 216, 217 are separately used for the n-channel transistor and the p-channel transistor to lower the resistivity of the source/drain electrodes or the gate electrode, the same one may instead be used. In this case, it is no longer necessary to form the recesses for metal embedding in such n-channel and p-channel transistors independently of each other. This makes it possible to reduce the number of process steps. It is desirable in this case to use certain metals or silicide materials that are substantially the same as each other in SBH with respect to n-type Si and p-type Si.

In addition, the corresponding metal layers 216, 217 may not be formed of single layer. For example, after disposing chosen materials low in SBH with respect to n-type Si and p-type Si, a low resistivity material such as Al, W or a noble metal may be formed thereon, thereby enabling reduction of electrical resistivities of the source/drain electrodes or the gate electrode.

While silicide processes are employable for fabrication of metal silicides in direct contact with Si, execution of such silicide processes require provision of a Si layer with a specified thickness in a region covering up to its underlying pn junction. To minimize the thickness of this Si layer, certain techniques must be used for forming the silicide to be as thin as possible. The Si layer thickness minimization is effective for suppressing unwanted increases in parasitic capacitances between the gate electrode and the source/drain regions, while at the same time achieving the high-speed performance of IC components.

Further, the etching shown in FIG. 8 is not exclusively limited to anisotropic etching such as RIE or the like, but may be isotropic etching, such as plasma etching using $CF_4$-containing gases, for example, or alternatively those using a chosen liquid such as fluoro nitric acid.

In cases where anisotropic etching and isotropic etching are used in combination, the shape of a finally obtained metal and that of contact faces of the source/drain electrodes are different as shown in FIGS. 1 and 2.

Although fabrication is performed while letting respective regions be masked to individually form the n-channel transistor and the p-channel transistor, such individual formation may be eliminated. In the case of individual formation, what is first formed may be any one of the p-channel transistor and the n-channel transistor on a case-by-case basis.

The material that is low in SBH relative to p-type Si is not limited only to platinum (IPt) and palladium (Pd), and may alternatively be iridium (Ir), nickel (Ni), or silicides thereof. Further, the material low in SBH relative to n-type Si is not limited only to $ErSi_2$ and may alternatively be hafnium (H.F.), tantalum (Ta), scandium (Sc) or silicides thereof.

The field effect transistors shown in FIG. 10 are such that when looking at the structures over the source/drain regions 213, 214, the side face of a respective source/drain semiconductor layers 210, 212 is formed so that this face forms an acute angle with respect to the semiconductor substrate surface. Accordingly, the side face of each of the source/drain semiconductor layers 210, 212 and the side face of the gate electrode oppose each other at a certain angle rather than in a parallel fashion. Thus, it is possible to prevent parasitic capacitances from greatly increasing in value.

Since the recesses are formed in the top surfaces of the source/drain semiconductor layers with the source/drain electrodes buried therein, it is possible for the device structure to enlarge the resultant contact areas, which in turn makes it possible to reduce contact resistivities. Obviously, contacts or junctions shallow enough to preclude occurrence of short-channel effects are formed. This ensures that the resulting pn junction is free from risks of degradation of leakage characteristics due to metal deposition.

An explanation will next be given of another semiconductor device manufacturing method according to the present invention with reference to FIGS. 12 to 19.

Figure 12:
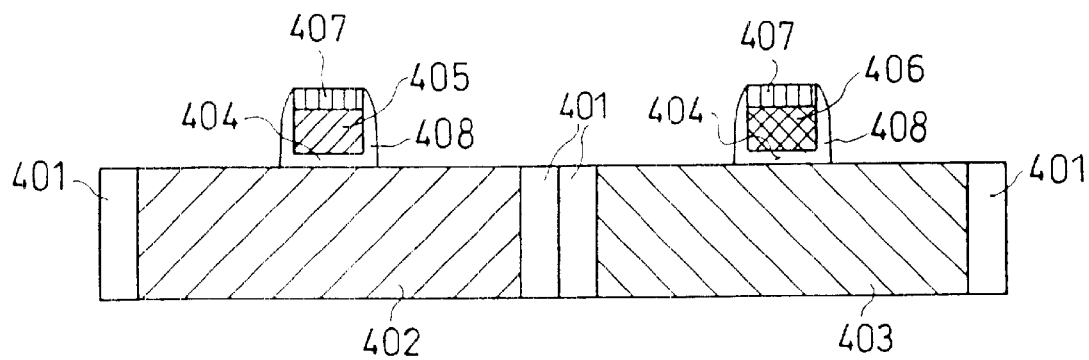
FIGS. 12 to 25 illustrate in cross-section some major process steps in the manufacture of the further aspect of the present invention.

First, as shown in FIG. 12, to fabricate element isolation regions 401 on the principal surface of a semiconductor substrate, the Si substrate is etched to form grooves for shallow trench isolation (STI) to a depth of approximately 0.4 $\mu$m. Thereafter, a layer of $SiO_2$ is deposited on the entire surface by CVD methods. Then, chemical/mechanical or "chemo-mechanical" polishing (CMP) is applied to thereby planarnize the entire surface.

Then, selected portions corresponding to a p-channel transistor formation region and an n-channel transistor formation region are masked by a photolithography process. Thereafter, ion implantation is performed to form an n-type well region 403 and a p-type well region 402 respectively. Next, for adjusting the threshold potentials of such transistors, ion implantation is performed at respective channel formation regions.

Then, a $TiO_2$ film 404, which will become a gate insulation film (first dielectric film), is deposited on the entire surface of the Si substrate (semiconductor substrate) to a thickness of about 20 nm while a mixture gas of tetraisopropyl titanate (TPT) $(Ti(OC_3H_7)_4)$ and oxygen react at a temperature of 380° C.

Next, a layer of poly-SiGe (first semiconductor layer) is deposited on the entire surface of the gate insulation film 404 to a thickness of about 50 nm. This layer may be fabricated by either one of the CVD and sputter techniques.

Next, after masking the p-channel formation region and the n-channel formation region using photolithography process, a chosen impurity, (e.g., phosphorus (P) or boron (B)) is doped by ion implantation techniques with a dose of about $1 \times 10^{15}$ $cm^{-2}$.

Then, a $SiO_2$ film 407 is deposited on the entire surface to a thickness of about 20 nm. Either one of the CVD and sputter techniques is employable therefor. Next, the impurity doped in the poly-SiGe is activated through annealing (in a $N_2$ gas at 800° C. for 30 minutes), thereby forming an n+-type SiGe gate electrode 405 and a $p^+$-type SiGe gate electrode 406 over the—and p-channel formation regions, respectively.

Next, reactive ion etching (RIE) techniques are used to etch the gate insulation film (first dielectric film) 404 and the poly-SiGe gate electrodes 405, 406 plus the $SiO_2$ film 407. Then, after depositing a $SiO_2$ film on the entire surface by CVD techniques to a thickness of about 10 nm, gate sidewalls 408 are fabricated by an RIE process on side faces of the gate electrodes (first semiconductor layers) 405, 406. Each gate sidewall 408 is about 10 nm thick.

Figure 13:
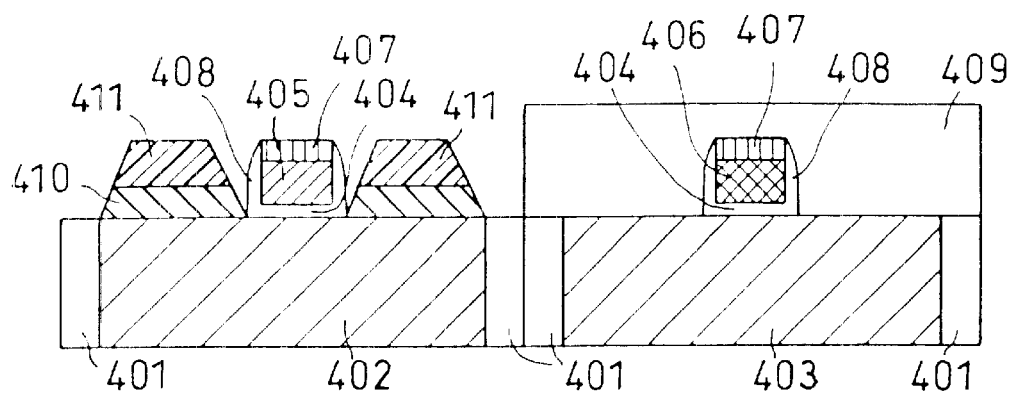

Next, as shown in FIG. 13, a SiN film is deposited on the entire surface to a thickness of about 50 nm. Thereafter, a photolithography process is used to perform etching, thereby causing the SiN film 409 to reside only at a selected part overlying the p-channel transistor formation region.

Next, through gas or vapor phase growth in a mixture gas of $SiH_4$ and $PH_3$ plus HCl at 600° C., Si source/drain semiconductor layers (second semiconductor layers of a first conductivity type) 410 containing a phosphorus impurity with a doping concentration of $1\times10^{20}$ $cm^{-3}$ are selectively deposited only at an exposed portion (n-channel transistor formation region) of the semiconductor substrate to a thickness of about 20 nm.

Next, in the same vacuum, vapor phase growth is performed in a mixture gas of $GeH_4$, $SiH_4$, $PH_3$ and HCl to thereby selectively deposit about 50 nm thick SiGe source/drain semiconductor layers (third semiconductor layers of the first conductivity type different in composition from the second semiconductor layers) 411 containing phosphorus doped to a concentration of $1\times10^{20}$ $cm^{-3}$ on the source/drain semiconductor layers 410. In this case, since the $SiO_2$ film 407 exists on the gate electrode 405, Si and SiGe layers are not deposited. Thus, the resulting poly-SiGe gate electrode 405 and the Si source/drain semiconductor layers 410 are almost flush with each other on the top surfaces thereof.

In addition, setting the deposition temperature at 600° C. or more results in the deposited Si or SiGe layers being single-crystals. Due to this, a specified face of the source/drain semiconductor layers 410 opposing the gate sidewall 408 becomes a {111} or {311} plane, thus forming a facet. While the crystal plane orientation of this facet is variable depending upon the fabrication conditions, process control is performed to ensure that an angle between the side face of source/drain semiconductor layer 410 and the surface of the semiconductor substrate becomes an acute angle. Thereafter, the SiN film 409 overlying the p-channel transistor formation region is removed by use of a "hot" phosphoric acid or alternatively by dry etching techniques.

Figure 14:
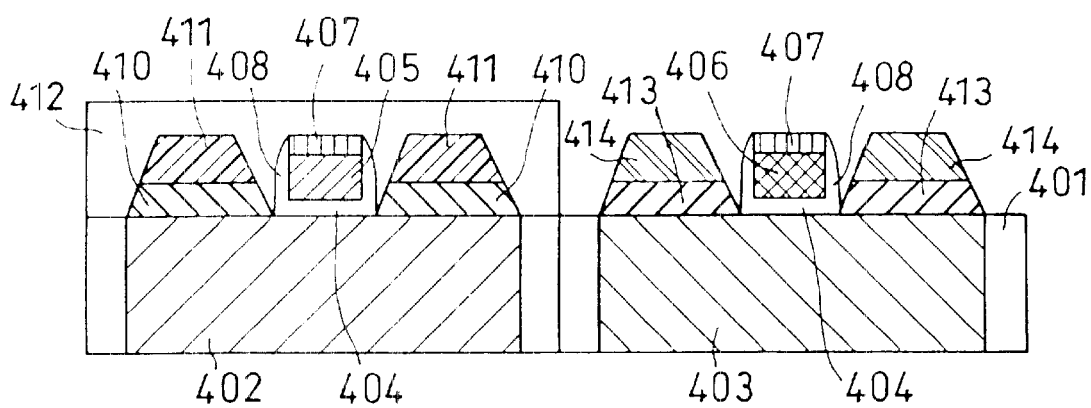

As shown in FIG. 14, after depositing a SiN film on the overall surface to a thickness of about 50 nm, a photolithography process is used to perform etching, thereby causing the SiN film 412 to reside only at selected part overlying the n-channel transistor formation region.

Through vapor phase growth in a mixture gas of $SiH_4$ and $B_2H_6$ plus HCl at 600° C., Si source/drain semiconductor layers (second semiconductor layers of a second conductivity type) 413 containing a boron (B) impurity with a concentration of $1\times10^{20}$ $cm^{-3}$ are selectively deposited only at an exposed portion (p-channel transistor formation region) of the semiconductor substrate to a thickness of about 20 nm.

Next, in the same vacuum, vapor phase growth is performed in a mixture gas of $GeH_4$, $SiH_4$, $B_2H_2$ and HCl to thereby selectively deposit about 50 nm thick SiGe source/drain semiconductor layers (third semiconductor layers of the second conductivity type different in composition from the second semiconductor layers) 414 containing boron (B) doped to a concentration of $1\times10^{20}$ $cm^{-3}$. In this case, since the $SiO_2$ film 407 exists on the gate electrode 406, Si and SiGe layers are not deposited. Thus, the resulting poly-SiGe gate electrode 406 and the Si source/drain semiconductor layers 413 are almost flush with each other on the top surfaces thereof.

Further, setting the deposition temperature at 600° C. or more results in the deposited Si or SiGe layers being single-crystals. Thus, a specified portion of the source/drain semiconductor layers 413 opposing the gate sidewall becomes a {111} or {311} plane, thus forming a facet. While the crystal plane orientation of this facet is variable depending upon the fabrication conditions, the process control is performed to ensure that an angle between the side face of the source/drain semiconductor layer 413 and the surface of the semiconductor substrate becomes an acute angle. Thereafter, the SiN film 412 overlying the n-channel transistor formation region is removed using a hot phosphoric acid or alternatively by dry etching techniques.

Figure 15:
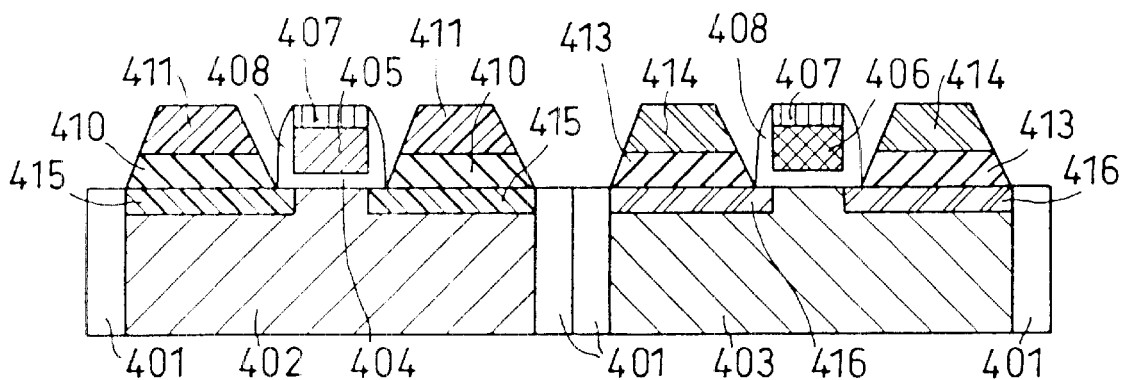

As shown in FIG. 15, thermal processing is performed in an argon (Ar) gas at 600° C. for 60 minutes, causing the doped phosphorus impurity to out diffuse into the semiconductor substrate through the n-type Si source/drain semiconductors 410, while at the same time letting the boron (B) impurity diffuse into the substrate via the p-type source/drain semiconductors 413 to thereby form the n-type source/drain regions 415 and the p-type source/drain regions 416 respectively. The source/drain regions 415, 416 are very shallow in the semiconductor substrate to the extent that each has a reduced depth ranging from about 10 to 20 nm. This makes it possible to sufficiently suppress short-channel effects of transistors thus fabricated.

Figure 16:
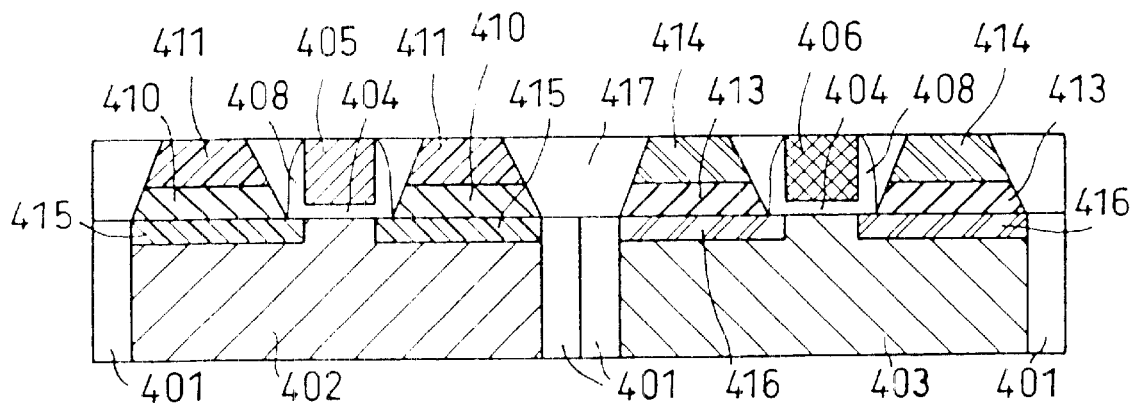

As shown in FIG. 16, a $SiO_2$ film (second dielectric film) 417 is deposited on the entire surface to a thickness of about 100 nm.

Then, a CMP process is used to remove an upper portion of the $SiO_2$ film 417 to the extent that top surfaces of the gate electrodes (first semiconductor layers) 405, 406 and the source/drain semiconductor layers (third semiconductor layers) 411, 414 are exposed both in the n-channel transistor formation region and in the p-channel transistor formation region.

Figure 17:
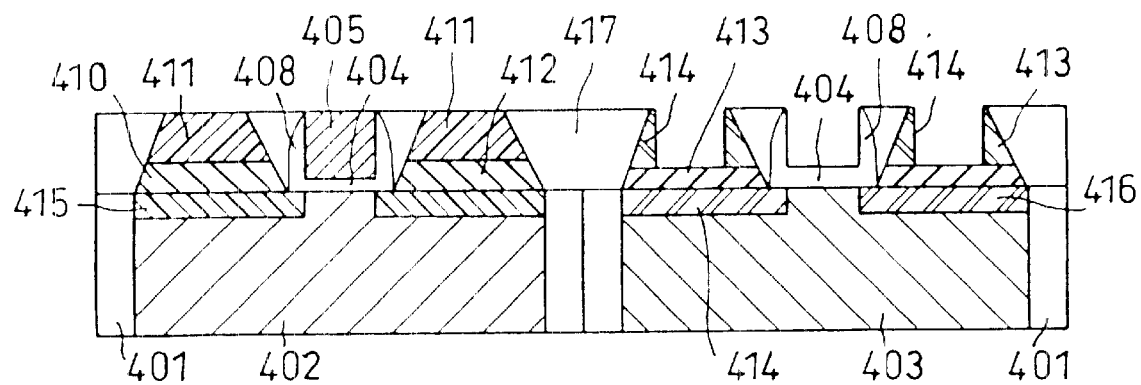

As shown in FIG. 17, after forming a resist film (not shown) overlying only the n-channel transistor formation region by using a photolithography process, etching is performed by RIE methods on a specified part of the source/drain semiconductor layers (third semiconductor layers) 414 and the SiGe gate electrode (first semiconductor layer) 406. In this case, using a mixture gas of $CF_4$ and argon (Ar) under appropriate conditions makes it possible to selectively remove SiGe with respect to Si. Thus, it is possible to readily control the process so that etching stops at the interface of the source/drain semiconductor layers 411 and the source/drain semiconductor layers 410. Thereafter, the resist is removed causing etched portions to reside with recess-like shapes.

Figure 18:
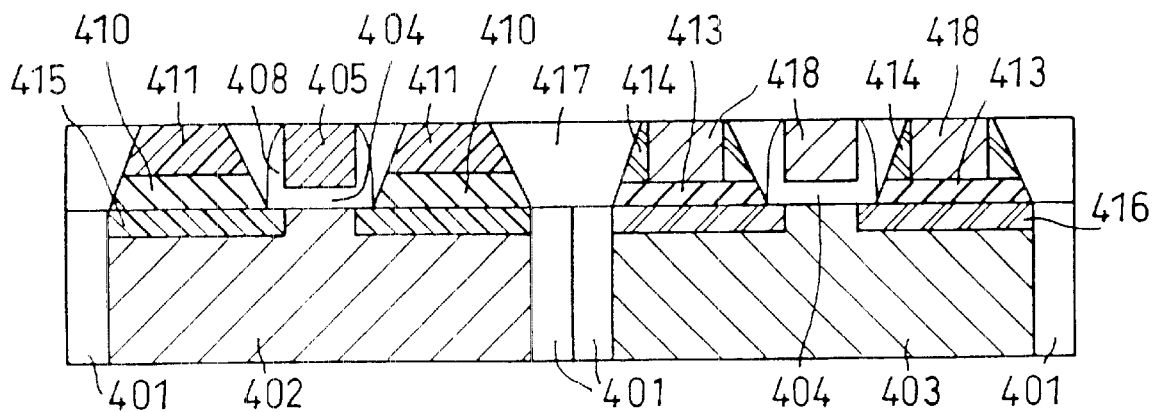

As shown in FIG. 18, a layer of chosen conductive material for use as source/drain and gate electrodes is deposited on the entire surface. The material may be metals or suicides, or in particular those materials low in Schottky barrier height (SBH) relative to p-type Si such as platinum (Pt), PtSi, palladium (Pd) or the like. This deposition may be performed by any one of the CVD, sputter and other known entire-surface deposition methods.

Next, entire-surface etching is performed by CMP techniques until the $SiO_2$ film 417 is detected. With this process, it is possible to form the source and drain electrodes 418 in the recess portions formed in the top surfaces of the source/drain semiconductor layers 413. Simultaneously, it is also possible to form a gate electrode 418 in a recess formed in the top surface of the gate insulation film 404.

Figure 19:
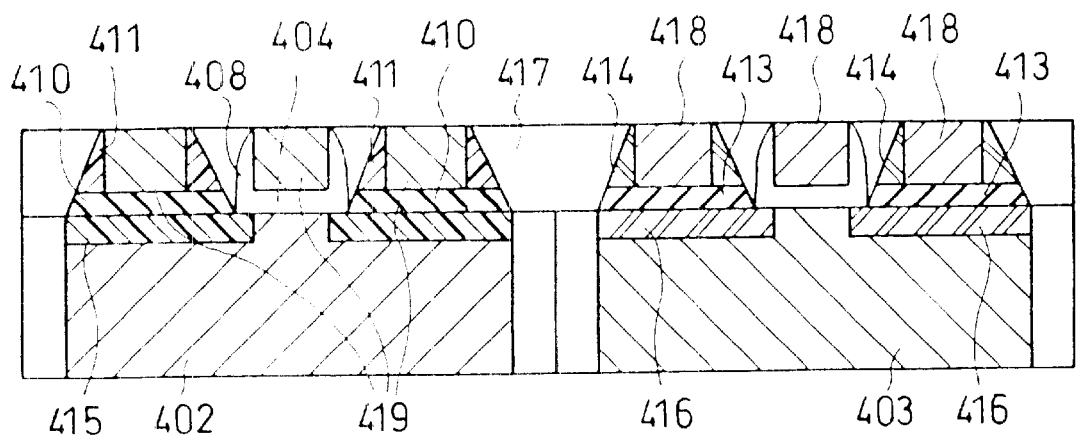

As shown in FIG. 19, after forming a resist film (not shown) by a photolithography process only at a selected portion overlying the p-channel transistor, part of the source/drain semiconductor layers (third semiconductor layers) 411 and the SiGe of gate electrode (first semiconductor layer) 407 are etched by RIE methods. In this case, since the use of the mixture gas of $CF_4$ and argon (Ar) under appropriate conditions makes it possible to selectively remove SiGe with respect to Si, it is possible to readily achieve the etching stop at the interface of the source/drain semiconductor layers 411 and the source/drain semiconductor layers 410. Thereafter, the resist is removed causing only the etched portions to reside with recess-like shapes.

Then, a selected material low in Schottky barrier height (SBH) relative to n-type Si, such as $ErSi_2$ is deposited on the entire surface. This deposition process may be performed by using the CVD, sputter or any other similar entire-surface deposition techniques. Further, required electrodes reformed in the recesses which have been defined by CMP-based etching as applied to the entire surface until the $SiO_2$ film is detected. That is, a gate electrode 419 is formed on the gate insulation film 204 while the source/drain electrodes (metals or suicides) 419 are formed on the source/drain semiconductor layers (second semiconductor layers ) 410.

Next, a $SiO_2$ film (not shown) is entirely deposited and is then selectively etched to form therein contact holes (not shown) for establishment of electrical interconnection wires or on chip leads (not shown), thereby forming an LSI.

Although in this aspect, the gate insulation film 410 is exemplarily made of $TiO_2$ with a high dielectricity, this material may be replaced with other similar suitable materials including, but not limited to, $Ta_2O_5$, $Al_2O_3$, $Y_2O_3$, $ZrO_2$, and $(Ba, Sr)TiO_3$. In addition although the $TiO_2$ film is formed by MOCVD techniques, this film may alternatively be formed by sputtering.

Optionally, during depositing the $TiO_2$ gate insulation film 410, a xenon (Xe) lamp of 200 watts (W) may be used. The Xe lamp is operated to emit near-ultraviolet rays with a wavelength of 300 nm, which travels through a window of deposition equipment to fall onto the entire surface of a wafer. This lamp is rendered operative prior to the flow of a deposition gas and is continuously activated until termination of the intended deposition process. With such an arrangement, it is possible to preclude an unwanted mixture of carbon (C) and/or proton (H) coming from organic source gases used, which in turn makes it possible to deposit a film having its composition be almost completely $TiO_2$.

Additionally, the raw material gas used for the MOCVD process is not limited only to the gas with the above-noted combination, and may also be a mixture gas of ethyltitanate (TET) ($Ti(OC_2H_5)_4$) or titanium-tetrakis-isopropoxide (TTIP) and oxygen. In the case of TTIP, the $TiO_2$ may be fabricated without a mixture of oxygen. Still alternatively, the organic source is replaceable by an inorganic source such as $TiCl_4$. If this is the case, it is desirable that the reaction temperature be made a little higher, for example, to 600° C. or more or less.

Further, the gate insulation film 404 may not always be formed of the above-noted high dielectricity film and may alternatively be made of $SiO_2$ or SiN. In addition, the gate insulation film 404 does not necessarily make use of the first deposited dielectric film. One example is that after having removed the poly-SiGe 406 of the gate section at the process step of FIG. 17, the dielectric film 404 is temporarily removed and thereafter another material (such as $SiO_2$, SiN, a high-dielectricity film, a ferroelectric film or the like) is newly deposited for use as the gate insulation film.

Obviously, at this time, part of the gate insulation film 204 may be left. One example is that after etching the SiGe to have a predefined thickness of about 40 nm at the step of FIG. 17, surface cutaway is performed causing this thickness to decrease to 20 nm at this step to sufficiently clean the top surface of $TiO_2$ film 404.

If necessary, a TiN layer may be formed on the $TiO_2$ gate insulation film 404 for preventing a chemical reaction between the gate insulation film 204 and its associated gate material, for example.

Further, the etching at the step of FIG. 17 may not always be designed to entirely remove the poly-SiGe 407 of the gate section. In this case, as shown in FIG. 11, the gate electrode comes to have a multilayer structure comprising metals 301, 303 and poly-SiGe 302, 304. Thus, it is possible to achieve the surface channel configuration of an n-channel transistor using n-type SiGe and a p-channel transistor using p-type SiGe while simultaneously permitting the gate electrode to offer low resistivity due to the presence of such metals. Obviously, in this case also, the metals installed at n and p may be set at work functions in a way independent from each other. Thus, it is possible to minimize contact resistivities between the poly-SiGe 302, 304 and metals 301, 303.

On the other hand, in case the poly-SiGe 406 is entirely removed at the step of FIG. 17, the poly-SiGe layers 405, 406 containing different impurities may be designed to contain a single type of impurity (e.g., phosphorus-diffused poly-SiGe) or alternatively designed to not contain impurities. However, in this case, it is difficult at the etching step of FIG. 17 to control at the same rate as that of impurity-doped SiGe. In view of this, it is desirable that the layers contain the same impurity.

In addition, the single-crystal SiGe layers 411, 414 deposited by the SEG process is not limited only to the scheme for doping into CVD. For example, at the process step of FIG. 13, "pure" single-crystal Si not containing impurities is selectively pre-deposited at Si exposure portions of the n-channel transistor formation region and the p-channel transistor formation region. Then, single-crystal SiGe with no impurities doped thereinto is selectively deposited. Thereafter, ion implantation is performed to form the individual impurity-containing portion(s). This ion implantation may be performed immediately after fabrication of the single-crystal SiGe, or alternatively after completion of the CMP process of the dielectric film 417 as shown in FIG. 16. Note here that because the presence of point defects occurring due to ion implantation makes the impurity diffusion control difficult at later steps, it is impossible to precisely control the pn junction to fall within a range of 10 nm to 20 nm in the substrate. Accordingly, CVD simultaneous doping methods are considered more preferable in this case.

Obviously, in CVD-based dope methods, the impurity amount may not be uniform in a direction along the thickness of Si. One considered example of possible variations is that the impurity concentration is higher at part near the Si substrate and lower at part distant far therefrom.

Further, the pn junctions in the n-channel transistor formation region and the p-channel transistor formation region may be preformed by ion implantation prior to the deposition of the single-crystal Si.

During selective deposition of single-crystal Si, in order to retain its selectivity higher, it is desirable that $H_2$ annealing or vacuum annealing within the CVD apparatus is performed at close to 800° C., for example, to remove any residual natural oxide films on the exposed Si surfaces, thus enabling a Si with excellent crystallinity to be reliably fabricated on or over Si.

The crystallinity of single-crystal Si thus deposited might affect the reproducibility of etch treatment at the FIG. 17 step and also influence the characteristics of IC components in the form of reproducibility of metal contact resistivities.

Although, the metallic materials 418, 419 are separately used for the n-channel transistor and the p-channel transistor to lower the resistivity of the source/drain electrodes or the gate electrode, the same one may instead be used. In this case, it is no longer necessary to form the recesses for metal embedding in such n-channel and p-channel transistors independently of each other. This makes it possible to reduce the number of process steps. It is desirable in this case to use certain metals or silicide materials that are substantially the same as each other in SBH with respect to n-type Si and p-type Si.

In addition, the corresponding metal layers 418, 419 may not be formed of a single layer. For example, after depositing chosen materials low in SBH with respect to n-type Si and p-type Si, a low resistivity material such as aluminum (Al), tungsten (W) or a noble metal may be formed thereon, thereby enabling reduction of electrical resistivities of the source/drain electrodes or the gate electrode.

While silicide processes are employable for fabrication of metal suicides in direct contact with Si, execution of such silicide processes require provision of a Si layer with a specified thickness in a region covering up to its underlying pn junction. To minimize the thickness of this Si layer, certain techniques must be used for forming the silicide to be thin as possible. The Si layer thickness minimization is effective for suppressing unwanted increases in parasitic capacitances between the gate electrode and the source/drain regions, while at the same time achieving the high-speed performance of IC components.

Further, the etching of the SiGe shown in FIG. 17 is not exclusively limited to anisotropic etching such as RIE or the like, but may be isotropic etching such as plasma etching using $CF_4$-containing gases, for example, or alternatively those using a chosen liquid such as fluoronitric acid.

In cases where anisotropic etching and isotropic etching are used in combination, the shape of a finally obtained metal and that of contact faces of the source/drain electrodes are different as shown in FIGS. 1 and 2.

Although fabrication is performed while letting respective regions be masked to individually form the n-channel transistor and the p-channel transistor, such individual formation may be eliminated. In the case of individual formation, what is first formed may be any one of the p-channel transistor and the n-channel transistor on a case-by-case basis.

The material that is low in SBH relative to p-type Si is not limited only to platinum (Pt) and palladium (Pd) and may alternatively be iridium (Ir), nickel (Ni), or silicides thereof. Further, the material low in SBH relative to n-type Si is not limited only to $ErSi_2$ and may alternatively be hafnium (H.F.), tantalum (Ta), scandium (Sc) or suicides thereof.

Additionally, although two semiconductor layers overlying the source/drain regions are formed so that the upper layer is Si, whereas the lower layer is SiGe, the lamination order may be reversed in a way such that the lower layer is SiGe and the upper one is Si. When this is done, care should be taken to remember that the selective etching of SiGe corresponding to the step of FIG. 17 becomes selective etching of Si with respect to SiGe. In this case, the etching solution or etchant should also be changed. For example, 10-wt % ammonia water is employable for enabling successful etching of Si with an increased selectivity relative to SiGe. Also preferably, Si rather than SiGe may be used as the gate material of FIG. 12. If this is the case, it is not Si, but SiGe that is in contact with the metals 418, 419. Thus, it will be expected the resultant contact resistivities become lower, especially at the p-channel transistor.

Although the concentration of SiGe is set at 1:1, the present invention is not exclusively limited to this concentration ratio. Note, however, that it is desirable that a concentration of Ge be reduced at a specified level which enables establishment of sufficient etching selectivity, as has been pointed out that in single-crystal growth on Si, deformation can enter due to lattice constant differences and also that if such deformation is too large then defects occur.

Although SiGe is used as the second semiconductor layer, this invention is not limited thereto and SiGe may be replaced by SiC. Other similar materials may also be used as long as the materials are capable of deposition on or over Si with enhanced selectivities equivalent to that of SEG, while at the same time offering etchabilities with good selectivities relative to Si.

A semiconductor device manufacturing method in accordance with a further aspect of the present invention will now be explained with reference to FIGS. 20–25.

Figure 20:
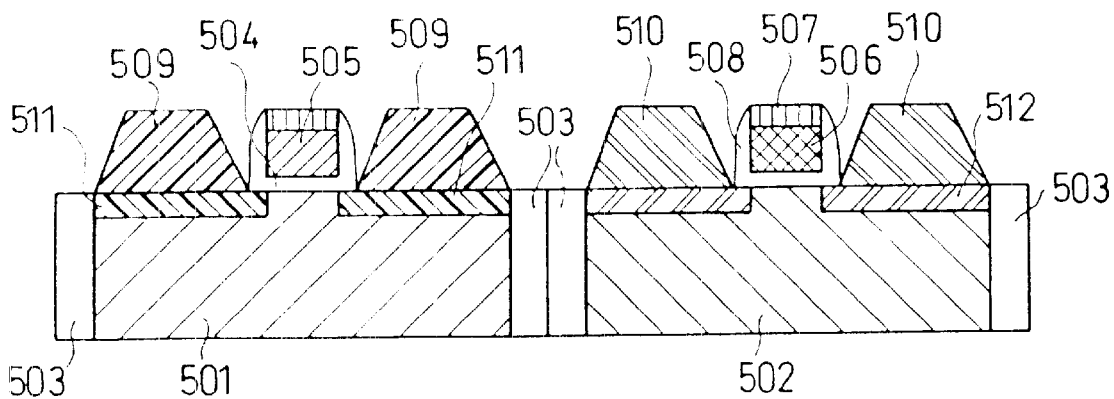

First, a device as shown in FIG. 20 is fabricated. This device has on the principal surface of a semiconductor substrate several element isolation regions 503, a gate insulation film (first dielectric film) 504, Si films (first semiconductor layers) 505, 506, a gate sidewall 508, a $SiO_2$ dielectric film 507, and Si source/drain semiconductor layers (second semiconductor layers of the first and second conductivity types) 509, 510, with a shallow $n^+$ and $p^+$ type diffusion layers 511, 512 being formed beneath layers 509, 510. The fabrication process of these layers is similar to the process steps of the semiconductor device manufacturing method discussed previously with reference to FIGS. 3–6.

Figure 21:
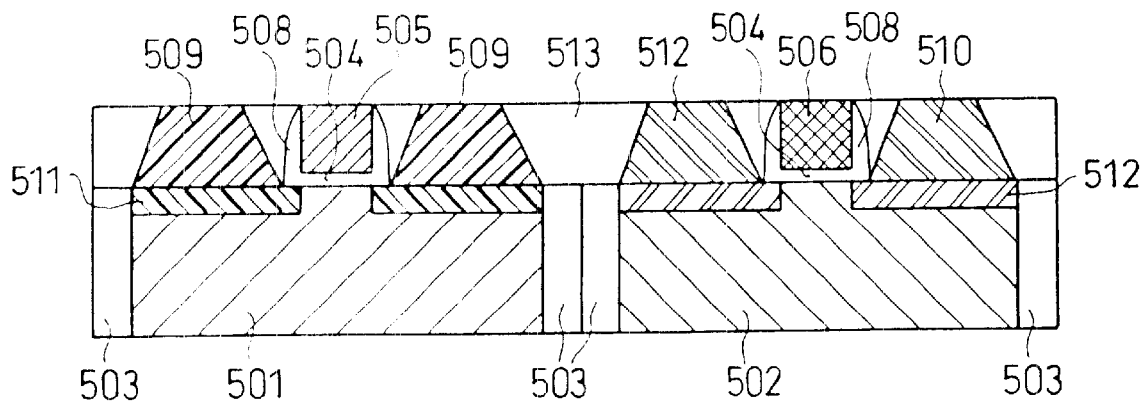
Figure 22:
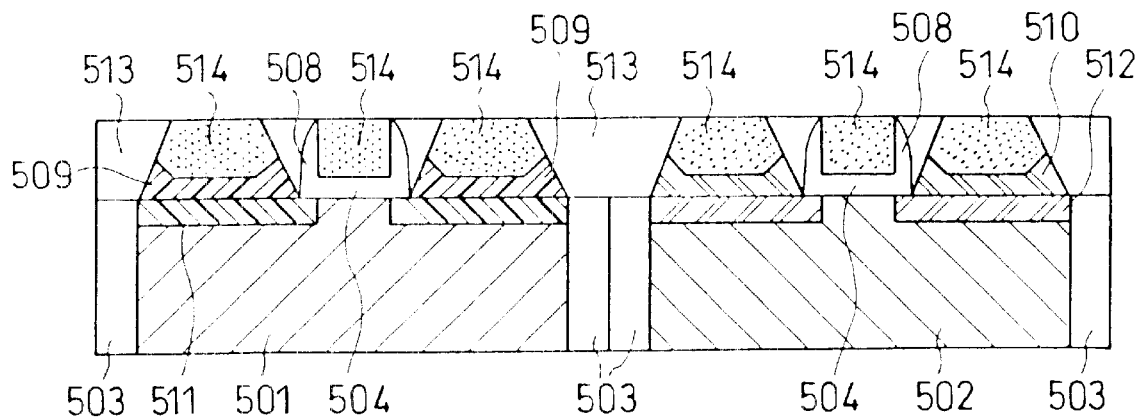

As shown in FIG. 21, a $SiO_2$ film (second dielectric film) 513 is deposited on the entire surface to a thickness of about 100 nm. Next, CMP methods are used to remove an upper portion of the $SiO_2$ film 513 until top surfaces of the gate electrodes (first semiconductor layers) 505, 506 and the source/drain semiconductor layers (second semiconductor layers) 509, 510 are exposed both in the n-channel transistor formation region and in the p-channel transistor formation region. Next, as shown in FIG. 22, from-the-surface thermal processing is performed to form a $SiO_2$ film 514 through 50-nm oxidation of the Si films 505, 506 until arrival at the $TiO_2$ film 504 at the gate electrode sections. Further, at the same time, oxidation is performed to ensure that the Si source/drain semiconductors (second semiconductor layers) 509, 510 partly reside. In this process, surface portions of the source/drain semiconductor layers 509, 510 are to be oxidized in such a way that a specified part with a thickness of about 20 nm from the semiconductor substrate interface is left. At this time, it is desirable that the same conditions be used in the oxidation rate of Si with phosphorus (P) and boron (B) doped thereinto. Further, since oxidation progresses isotropically from the surfaces of such impurity-doped Si source/drain semiconductor layers 509, 510, recess portions are formed in the surfaces of source/drain semiconductor layers 509, 510.

Figure 23:
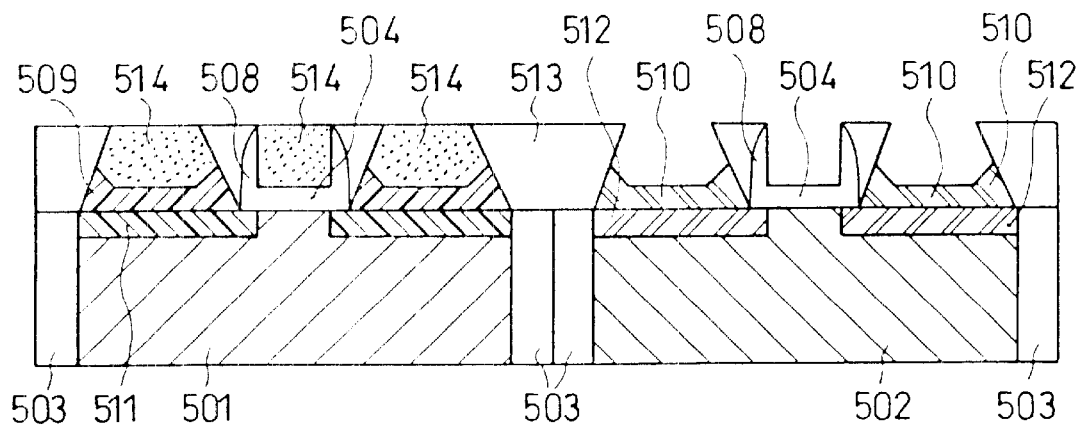

As shown in FIG. 23, after selectively forming a resist film (not shown) by a photolithography process only at a certain part overlying the n-channel transistor formation region, a chosen solution containing dilute hydrofluoric acid (HF) is used to remove selected portions of the $SiO_2$ film 514 overlying the source/drain semiconductor layers 510 and the gate insulation film 504 of the p-channel transistor formation region. At this process step, because the CVD-formed $SiO_2$ film 513 contains no impurities, whereas the $SiO_2$ film 514 contains an increased amount of boron (B), the etching rate due to the dilute hydrofluoric acid solution stays high permitting the $SiO_2$ film 514 to be etched as shown in FIG. 23, while the $SiO_2$ film 513 is hardly etched away.

Next, a layer of chosen conductive material for use as the source/drain and gate electrodes is deposited on the entire surface. The material may be metals or silicides, or in particular those materials low in Schottky barrier height ( SBH) relative to p-type Si such as platinum (Pt), PtSi, or palladium (Pd). This deposition may be performed by any one of the CVD, sputter and other known entire-surface deposition methods.

Figure 24:
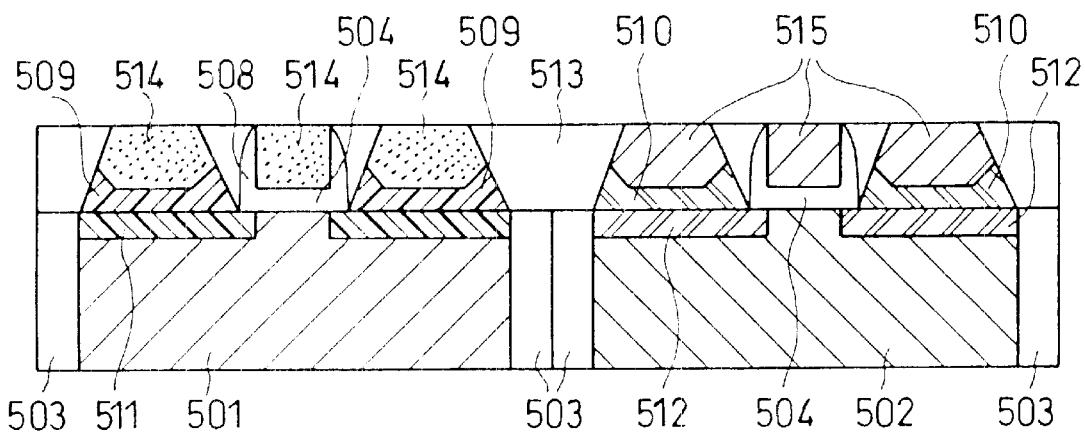

As shown in FIG. 24, entire-surface etching is performed by CMP techniques until the $SiO_2$ film 513 is detected. With this process, it is possible to fabricate source/drain electrodes 515 in recesses formed in top surfaces of the source/drain semiconductor layers 510. Simultaneously, it is also possible to form a gate electrode 515 in a recess defined in the top surface of the gate insulation film 504.

Figure 25:
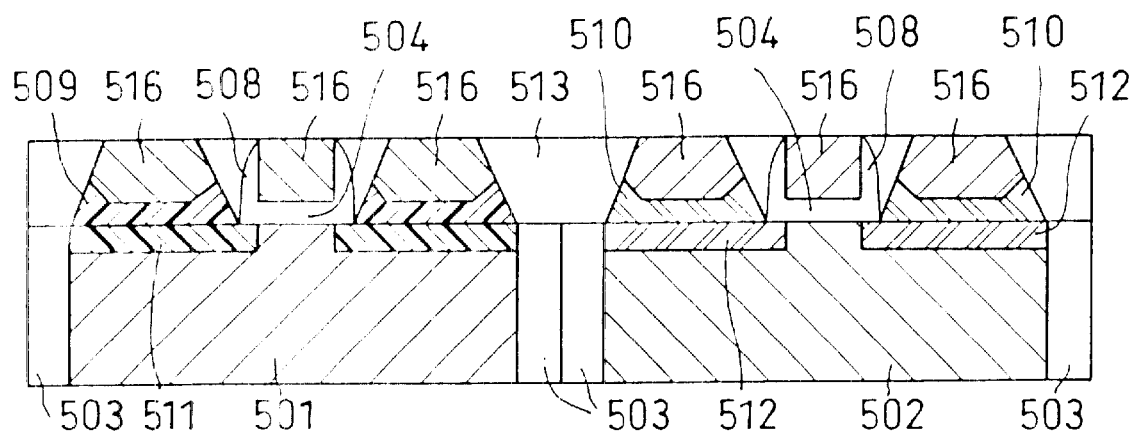

As shown in FIG. 25, after selectively forming a resist film (not shown) by a photolithography process only at a certain portion overlying the p-channel transistor formation region, a chosen solution containing dilute hydrofluoric acid (HF) is used to remove selected portions of the $SiO_2$ film 514 overlying the source/drain semiconductor layers 514 in the n-channel transistor formation region. At this process step, because the CVD-formed $SiO_2$ film 513 does not contain impurities, whereas the $SiO_2$ film 514 contains an increased amount of phosphorus, the etching rate due to the dilute hydrofluoric acid solution stays high permitting the $SiO_2$ film 514 to be etched, while the $SiO_2$ film 513 is hardly etched away.

Next, a layer of chosen conductive material for use as the source/drain and gate electrodes is deposited on the entire surface. This material may be metals or silicides, or in particular certain materials low in Schottky barrier height (SBH) relative to n-type Si such as ErSi2. This deposition may be performed by any one of the CVD, sputter and other known entire-surface deposition methods.

Next, entire-surface etching is performed by CMP methods until the $SiO_2$ film 513 is detected. With this process, it is possible to fabricate source/drain electrodes 217 in recesses formed in top surfaces of the source/drain semiconductor layers 509. Simultaneously, it is possible to form a gate electrode 514 in a recess formed in the top surface of the gate insulation film 504.

Next, ordinary processes are performed for entire-surface deposition of a $SiO_2$ film (not shown) and for formation of contact holes (not shown) therein to provide electrical onchip leads (not shown), thus forming an LSI.

Although in this semiconductor device manufacturing method the gate insulation film 504 is exemplarily made of $TiO_2$ with a high dielectricity, this material may be replaced with other similar suitable materials including but not limited to $Ta_2O_5$, $Al_2O_3$, $Y_2O_3$, $ZrO_2$, and $(Ba, Sr)TiO_3$. In addition, although the $TiO_2$ film is formed by MOCVD methods, this film may alternatively be formed by sputtering.

Optionally, during deposition of the $TiO_2$ film, a xenon (Xe) lamp of 200 watts (W) is used. The Xe lamp is operated to emit near-ultraviolet rays with a wavelength of 300 nm, which travels through a window of deposition equipment to fall onto the entire surface of a wafer. This lamp is rendered operative prior to the flow of a deposition gas and is continuously activated until termination of the intended deposition process. With such an arrangement, it is possible to preclude an unwanted mixture of C and/or H coming from organic source gases used, which in turn makes it possible to deposit a film having its composition be almost completely $TiO_2$.

Additionally, the raw material gas used for the MOCVD process is not limited only to the gas with the above-noted combination, and may also be a mixture gas of ethyltitanate (TET) $(Ti(OC_2H_5)_4)$ or titanium-tetrakis-isopropoxide (TTIP) and oxygen. In the case of TTIP, the $TiO_2$ is fabricatable without a mixture of oxygen. Still alternatively, the organic source is replaceable by an inorganic source such as $TiCl_4$. If this is the case, it is desirable that the reaction temperature be made a little higher, for example, to 600° C. or more or less.

Additionally, the gate insulation film may not always be formed of the above-noted high dielectricity film and may alternatively be made of $SiO_2$ or SiN.

At the step of FIG. 22, the poly-Si of gate section may not always be oxidized entirely. Letting part of poly-Si be left results in the gate electrode becoming a multilayer structure of metals and polycrystalline semiconductor layers as shown in FIG. 11. Thus, it is possible to achieve the surface channel configuration of an n-channel transistor using n-type Si and a p-channel transistor using p-type Si, while permitting the gate electrode to offer low resistivity due to the presence of such metals. Obviously, in this case also, the metals installed at n and p are settable at separate work functions in a way independent from each other. Thus, it is possible to minimize contact resistivities between the poly-Si and metal.

In case the poly-Si of the gate section is entirely oxidized at the thermal oxidation step of FIG. 22, the poly-Si layers 505, 506 containing different impurities may be designed to contain a single type of impurity (e.g., phosphorus-diffused poly-Si) or alternatively designed not to contain impurities. However, in this case, it is difficult at the oxidation step of FIG. 22 to control at the same rate as that of impurity-doped Si. In view of this, it is desirable that the layers contain the same impurity.

The single-crystal Si layers 505, 506 deposited by the SEG process is not limited only to the approach of doping into CVD. For example, "pure" single-crystal Si not containing impurities is selectively pre-deposited at Si exposure portions of the n-channel transistor formation region and the p-channel transistor formation region, and thereafter ion implantation is performed to thereby form the individual impurity-containing portion(s). This ion implantation may be performed immediately after fabrication of the single-crystal Si, or alternatively after completion of the CMP process of the dielectric film 513 of FIG. 21. Note here that because the presence of point defects occurring due to ion implantation makes the impurity diffusion control difficult at later steps, it is impossible to precisely control the pn junction to fall within a range of 10 to 20 nm in the substrate. Accordingly, CVD simultaneous doping methods are considered more preferable.

Obviously, in CVD-based dope methods, the impurity amount may not be uniform in a direction along the thickness of Si. One example of possible variations is that the impurity concentration is higher at part near the Si substrate and lower at part distant far therefrom.

Further, the pn junctions in the n-channel transistor formation region and the p-channel transistor formation region may be performed by ion implantation prior to the deposition of the single-crystal Si.

During selective deposition of single-crystal Si, in order to retain its selectivity higher, it is desirable that $H_2$ annealing or vacuum annealing within the CVD apparatus is performed at close to 800° C., for example, to remove any residual natural oxide films on the exposed Si surfaces, thus enabling Si with excellent crystallinity to be reliably fabricated on or over Si. The crystallinity of single-crystal Si thus deposited influences the characteristics of resultant IC components in the form of reproducibility of metal contact resistivities.

In addition, the metallic materials 515, 516 for reducing resistivities of the source/drain electrodes or the gate electrode may also be made of a single type of material. If this is the case, it is no longer necessary to form the recesses for metal embedding n- and p-type portions independently of each other. This advantageously makes it possible to reduce the number of process steps. It is desirable in this case to employ certain metals or silicide materials that are substantially the same as each other in SBH with respect to n-type Si and p-type Si.

Further, the corresponding metal layers 515, 516 may not be a single layer. For example, after depositing chosen materials low in SBH with respect to n-type Si and p-type Si, a low resistivity material such as Al, W or a noble metal may be formed thereon, thereby enabling reduction of electrical resistivities of the source/drain electrodes or the gate electrode.

In cases where silicide processes are employed for forming metal silicides in direct contact with Si, this requires provision of a Si layer with a specified thickness in a region covering up to its underlying pn junction. To minimize the thickness of this Si layer, certain techniques must be used for forming the silicide to be as thin as possible. The Si layer thickness minimization is effective for suppressing unwanted increases in parasitic capacitances between the gate electrode and the source/drain regions, while at the same time achieving the high-speed performance of IC components.

Further, the oxidation process step shown in FIG. 22 is not limited to the process using a dry oxygen and may alternatively be moisture vapor oxidization or any one of those methods using radical oxygen, dilute oxygen, oxidation atmospheres with mixture of hydrochloric acid (HCl) gases, or the like.

This oxidation process is not necessarily designed to oxidize the entirety of a desired thickness portion at the same time, and may be modified so that a cycle of oxidation and etching steps will be repeated a plurality of times.

Although in the above aspect wet etching techniques are used to etch oxide films, this technique may be replaced by dry etching techniques, such as plasma etching methods or the like.

Although in FIG. 20 the deposited semiconductor layers 509, 510 are each formed of a single layer, the semiconductor layers may be designed to have a multilayer structure using SiC, for example. In this case, it is also possible to increase the Si thickness controllability of residual films by using a method for entirely oxidizing the SiC section due to an oxidation rate difference and then removing it away.

Although fabrication is performed while letting respective regions be masked to individually form the n-channel transistor and the p-channel transistor, such individual formation may be eliminated. In the case of individual formation, what is first formed may be any one of the p-channel transistor and the n-channel transistor on a case-by-case basis.

The material that is low in SBH relative to p-type Si is not limited only to platinum (Pt) and palladium (Pd) and may alternatively be iridium (Ir), nickel(Ni), or silicides thereof.

Further, the material low in SBH relative to n-type Si is not limited only to ErSi2 and may alternatively be hafnium (H.F.), tantalum (Ta), scandium (Sc) or silicides thereof.

The field effect transistors shown in FIG. 25 are such that when looking at the structures over the source/drain regions 511, 512, the side face of the source/drain semiconductor layers 509–510 is formed so that this face forms an acute angle with respect to the semiconductor substrate surface. Consequently, the structures are formed while preventing parasitic capacitances between the source/drain electrodes and the gate electrode from greatly increasing in value.

Further, since the recesses are formed in the top surfaces of the source/drain semiconductor layers with the source/drain electrodes buried therein, it is possible for the device structure to enlarge the resultant contact areas, which in turn makes it possible to reduce contact resistivities. Obviously, contacts or junctions shallow enough to preclude occurrence of short-channel effects are formed. This ensures that the resulting pn junction is free from risks of degradation of leakage characteristics due to metal deposition.

In addition, a CMOS structure has a feature that makes it easier to employ different metallic materials for a p-channel transistor and an n-channel transistor. This feature makes it possible to demonstrably reduce parasitic resistance values of both transistors at the same time.

Furthermore, regarding the gate electrode material, it is also possible to realize a certain material with its work function approximate to the level of an edge of conduction band Ec of Si in the case of an n-channel transistor, while at the same time realizing an installation of a specific material closer in work function to the level of an edge of valence electron band Ev of Si in the case of a p-channel transistor. This makes it possible to adequately design both transistors as IC components each having its channel formed in the surface while permitting them to have a metal gate structure. Thus, this approach enables provision of the structure and process which are extremely preferable for suppression of short-channel effects.

An explanation will next be given of a semiconductor device manufacturing method in accordance with a still further aspect of the present invention with reference to FIGS. 28–30.

Figure 28:
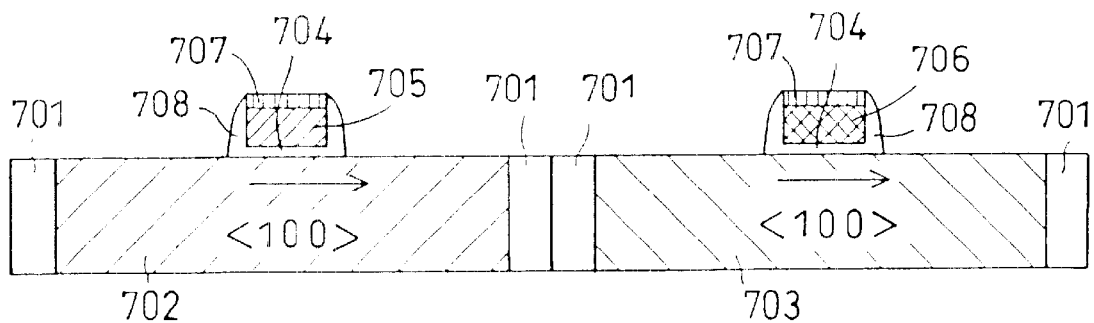
FIGS. 28–30 depict in cross-section some major process steps in the manufacture of a semiconductor device in accordance with another aspect of the present invention.

First, as shown in FIG. 28, to form element separation regions 701 in the principal surface of a semiconductor substrate 1 made of silicon (Si), for example, grooves for shallow trench isolation (STI) in the Si substrate are formed. Thereafter, a $SiO_2$ layer is deposited by CVD methods on the entire surface. Then, the entire surface is planarized by chemical/mechanical or "chemo-mechanical" polish (CMP) techniques.

After masking a p-channel transistor formation region and an n-channel transistor formation region by a photolithography process, ion implantation is performed to form an n-type well region 703 and a p-type well region 702, respectively. Thereafter, ion implantation is applied to respective channel sections for adjusting transistor threshold potentials.

A $TiO_2$ film 704 for use as a gate insulation film (first dielectric film) 704 is then deposited on the entire surface of the Si substrate (semiconductor substrate) to a thickness of about 20 nm, through a chemical reaction in a mixture gas of tetraisopropyl titanate (TPT) (Ti(OC$_3$H$_7$)$_4$) and oxygen at a temperature of 380° C.

A layer of polysilicon or "poly-Si" (first semiconductor layer) is next deposited on the entire surface of the gate insulation film 704 to a thickness of about 50 nm. This poly-Si layer may be fabricated by CVD or sputter techniques.

After masking the p-channel formation region and the n-channel formation region using a photolithography process, a chosen impurity (e.g., phosphorus (P) or boron (B)) is doped by ion implantation techniques with a dose of about $1 \times 10^{15}$ cm$^{-2}$.

A SiO$_2$ film is then deposited on the entire surface to a thickness of about 20 nm. Either one of the CVD and sputter techniques is employable therefor. Next, the impurity doped in the poly-Si is activated through annealing (in N$_2$ gas at 800° C. for 30 minutes), thereby forming an n+-type Si gate electrode 705 and a p+-type Si gate electrode 706 over the n- and p-channel formation regions, respectively.

Thereafter, reactive ion etching (RIE) techniques are used to etch the gate insulation film (first dielectric film) 704 and the poly-Si gate electrodes 705, 706 plus a SiO$_2$ film 707 into gate shapes. At this step, the processing is performed and causes the direction of a gate length to become <100> rather than <110>.

After depositing a SiO$_2$ film on the entire surface by CVD techniques to a thickness of 10 nm, gate sidewalls 708 are fabricated by an RIE process on side faces of the gate electrodes (first semiconductor layers) 705, 706. The gate sidewalls 708 each have a thickness of about 10 nm, as measured from a corresponding side face of the gate electrode.

Figure 29:
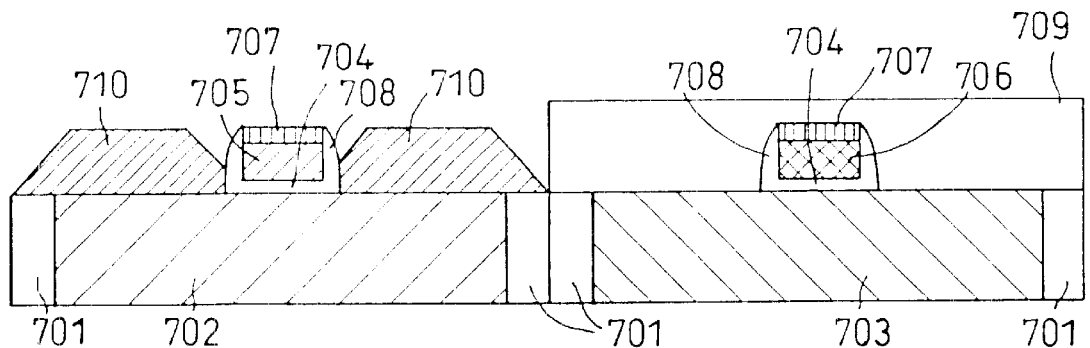

As shown in FIG. 29, a SiN film is deposited on the entire surface to a thickness of about 50 nm. Thereafter, a photolithography process is used to perform etching, thereby causing the SiN film 709 to reside only at selected part overlying the p-channel transistor formation region.

Through gas or vapor phase growth in a mixture gas of SiH$_4$ and PH$_3$ plus HCl at 600° C., Si source/drain semiconductor layers (second semiconductor layers of a first conductivity type) 710 containing a phosphorus impurity with a concentration of $1 \times 10^{20}$ cm$^{-3}$ are selectively deposited only at an exposed portion (n-type transistor formation region) of the semiconductor substrate to a thickness of about 70 nm. In this case, since the SiO$_2$ film 707 is present on the gate electrode 705, no layers are deposited. Thus, the resulting poly-Si gate electrode 705 and the silicon source/drain semiconductor layers 710 are almost flush with each other on the top surfaces thereof.

Further, setting the deposition temperature at 600° C. or more results in deposited Si being of single-crystal. Due to this, each portion in contact with the gate sidewall has a {110} preferred orientation, thus forming a facet. However, since silicon growth in this case is faster than the case of a facet formed on a {111} plane, silicon also grows on or over the gate sidewalls 708 and STIs 701. Accordingly, the side face of each of the source/drain semiconductor layers 710 facing the gate electrode 705 is brought into contact with the gate sidewall 708 at its lower part with a decreased thickness, and at the upper part thereof is "sloped" with an acute angle defined with respect to the semiconductor substrate surface.

Thereafter, the SiN film 709 overlying the p-channel formation region is removed using a "hot" phosphoric acid or alternatively by dry etching techniques.

Figure 30:
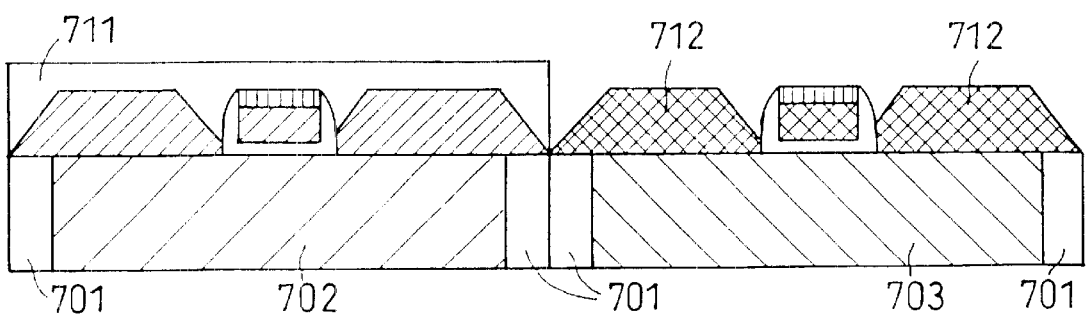

As shown in FIG. 30, after depositing a SiN film on the overall surface to a thickness of about 50 nm, a photolithography process is used to perform etching, thereby causing the SiN film 711 to reside only at a selected part overlying the n-channel transistor formation region.

Next, in a mixture gas of SiH$_4$ and B$_2$H$_6$ plus HCl at 600° C., Si source/drain semiconductor layers (second semiconductor layers of a second conductivity type) 712 containing a boron (B) impurity with a concentration of $1 \times 10^{20}$ cm$^{-3}$ are selectively deposited only at an exposed portion (p-channel transistor formation region) of the semiconductor substrate to a thickness of about 70 nm. In this case, since the SiO$_2$ film 707 is present on the gate electrode 706, any Si layer is never deposited. Thus, the resulting poly-Si gate electrode 706 and the Si source/drain semiconductor layers 712 are substantially flush with each other on the top surfaces thereof.

Note here that setting the deposition temperature at 600° C. or higher results in the deposited Si source/drain semiconductor layers 712 being single-crystals. Due to this, a specified face of the individual one of source/drain semiconductor layers 712 facing the gate sidewall becomes a {110} plane, thus forming a facet. However, since silicon growth in this case is faster than the case of a facet formed on a {111} plane, silicon also grows on or over the gate sidewalls 708 and STIs 701. Thus, the side face of each source/drain semiconductor layer 712 facing the gate electrode 705 comes into contact with the gate sidewall 708 at its lower part with a decreased thickness, and at the upper part thereof is "sloped" with an acute angle formed with respect to the semiconductor substrate surface.

Thereafter, the SiN film 709 overlying the p-channel formation region is removed using a hot phosphoric acid or dry etch methods. The process steps after the above process are similar to those stated supra in conjunction with FIGS. 6–10.

As stated above, the semiconductor device incorporating the principles of the present invention is capable of being designed to prevent parasitic capacitances from maximally increasing in value because the source semiconductor layer and drain semiconductor layer are in contact at an acute angle with the semiconductor substrate. Another advantage lies in an ability to increase the contact area resulting in a decrease in contact resistivity because concave portions are formed in top surfaces of the source/drain semiconductor layers with the source/drain electrodes being buried or embedded in these recesses.

In addition, the semiconductor device manufacturing method of the invention is such that the source/drain electrodes and the gate electrode are fabricated by etch-back techniques after completion of an entire-surface deposition process without employing any selective metal growth techniques. Consequently, electrical shorting between the source/drain electrodes will no longer take place, thus enabling improvement of production yields in the manufacture of the semiconductor device.

Obviously, numerous modifications and variations of the present invention are possible in light of the above teachings. It is therefore to be understood that within the scope of the appended claims, the invention may be practiced otherwise than as specifically described herein.

What is claimed is:

1. A transistor comprising:
   a semiconductor substrate;
   a gate insulation film formed on the semiconductor substrate;
   a gate electrode formed on the gate insulation film;
   a channel region formed in the semiconductor substrate below the gate insulation film;
   a source region and a drain region formed to be spaced apart from each other in the semiconductor substrate, said channel region being between the source region and the drain region;

a source semiconductor layer formed over the source region, said source semiconductor layer having a concave portion at an upper portion thereof and including an acute angle defined between a side face of the source semiconductor layer facing the gate electrode and a surface of the semiconductor substrate;

a drain semiconductor layer formed over the drain region, said drain semiconductor layer having a concave portion at an upper portion thereof and including an acute angle defined between a side face of the drain semiconductor layer facing the gate electrode and the surface of the semiconductor substrate;

a source electrode buried in the concave portion at the upper portion of the source semiconductor layer; and a drain electrode buried in the concave portion at the upper portion of the drain semiconductor layer, wherein said gate electrode, said drain electrode and said source electrode are formed of the same material selected from the group consisting of metal and metal silicide.

2. The transistor according to the claim 1, wherein the acute angle defined is 10° or greater than 80° or less.

3. The transistor according to the claim 1, wherein the acute angle defined is 20° or greater and 70° or less.

4. The transistor according to the claim 1, wherein the gate insulation film includes a materiel selected from the group consisting of metal oxide, metal nitride, metal oxynitride, and silicate.

5. The transistor according to the claim 1, wherein surfaces of the source semiconductor layer and the drain semiconductor layer in contact with the source electrode and the drain electrode respectively are formed by anisotropic etching.

6. The transistor according to the claim 1, wherein surfaces of the source semiconductor layer and the drain semiconductor layer in contact with the source electrode and the drain electrode respectively ale formed by isotropic etching.

7. A semiconductor device comprising:
   a common semiconductor substrate;
   an n-channel MISFET on the common semiconductor substrate and including:
      a gate insulation film formed on the common semiconductor substrate,
      a gate electrode formed on the gate insulation film,
      a channel region formed in the common semiconductor substrate below the gate insulation film,
      a source region and a drain region formed to be spaced apart from each other in the common semiconductor substrate, said channel region being between the source region and the drain region,
      a source semiconductor layer formed over the source region, said source semiconductor layer having a concave portion at an upper portion thereof and including an acute angle defined between a side face of the source semiconductor layer facing the gate electrode and a surface of the common semiconductor substrate,
      a drain semiconductor layer formed over the drain region, said drain semiconductor layer having a concave portion at an upped portion thereof and including an acute angle defined between a side face of the drain semiconductor layer facing the gate electrode and a surface of the common semiconductor substrate,
      a source electrode buried in the concave portion at the upper portion of the source semiconductor layer, and
      a drain electrode buried in the concave portion at the upper portion of the drain semiconductor layer; and
   a p-channel MISFET on the common semiconductor substrate including:
      a gate insulation film formed on the common semiconductor substrate,
      a gate electrode formed on the gate insulation film,
      a channel region formed in the common semiconductor substrate below the gate insulation film,
      a source region and a drain region formed to be spaced apart from each other in the common semiconductor substrate, said channel region being between the source region and the drain region,
      a source semiconductor layer formed over the source region, said source semiconductor layer having a concave portion at an upper portion thereof and including an acute angle defined between a side face of the source semiconductor layer facing the gate electrode and a surface of the common semiconductor substrate,
      a drain semiconductor layer formed over the drain region, said drain semiconductor layer having a concave portion at an upper portion thereof and including an acute angle defined between a side face of the drain semiconductor layer facing the gate electrode and a surface of the common semiconductor substrate,
      a source electrode buried in the concave portion at the upper portion of the source semiconductor layer, and
      a drain electrode buried in the concave portion at the upper portion of the drain semiconductor layer,
   wherein said gate electrode, said drain electrode and said source electrode of said n-channel MISFET are made of same material selected from metal and metal silicide, and
   wherein said gate electrode, said drain electrode and said source electrode of said p-channel MISFET are made of same material selected from the group consisting of metal and metal silicide and said source electrode, said drain electrode and said gate electrode of said n-channel MISFET are different material from said source electrode, said drain electrode and said gate electrode of said p-channel MISFET.

8. The semiconductor device according to claim 7, wherein the gate electrode of the n-channel MISFET is different material from the gate electrode of the p-channel MISFET.

* * * * *